(12) United States Patent
Kitamura

(10) Patent No.: US 9,932,441 B2
(45) Date of Patent: Apr. 3, 2018

(54) ORGANIC SEMICONDUCTOR ELEMENT, MANUFACTURING METHOD THEREOF, COMPOUND, COMPOSITION FOR FORMING ORGANIC SEMICONDUCTOR FILM, ORGANIC SEMICONDUCTOR FILM, AND MANUFACTURING METHOD THEREOF

(71) Applicant: FUJIFILM CORPORATION, Minato-ku, Tokyo (JP)

(72) Inventor: Tetsu Kitamura, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 15/497,226

(22) Filed: Apr. 26, 2017

(65) Prior Publication Data
US 2017/0226279 A1    Aug. 10, 2017

(30) Foreign Application Priority Data

Nov. 7, 2014    (JP) .................................. 2014-226657

(51) Int. Cl.
*H01L 29/786*    (2006.01)
*C08G 61/12*    (2006.01)
(Continued)

(52) U.S. Cl.
CPC ........... *C08G 61/122* (2013.01); *C08G 61/12* (2013.01); *C08L 65/00* (2013.01); *C08L 101/00* (2013.01);
(Continued)

(58) Field of Classification Search
None
See application file for complete search history.

(56) References Cited

U.S. PATENT DOCUMENTS 9,676,901 B2 *  6/2017  D'Lavari ............. C08G 61/126
9,695,190 B2 *  7/2017  Mitchell ............. H01L 51/0043
(Continued)

FOREIGN PATENT DOCUMENTS

JP    2007-516315 A    6/2007
JP    2013-057007 A    3/2013

*Primary Examiner* — Bilkis Jahan
(74) *Attorney, Agent, or Firm* — SOLARIS Intellectual Property Group, PLLC

(57) ABSTRACT

Objects of the present invention is to provide an organic semiconductor element having high mobility and excellent temporal stability under high humidity, and a manufacturing method thereof, to provide a novel compound which is suitable as an organic semiconductor, and to provide an organic semiconductor film having high mobility and excellent temporal stability under high humidity and a manufacturing method thereof, and a composition for forming an organic semiconductor film that can suitably form the organic semiconductor film.

The organic semiconductor element according to the present invention has an organic semiconductor layer containing a compound having a constitutional repeating unit represented by Formula 1.

20 Claims, 1 Drawing Sheet

(51) Int. Cl.
   *H01L 51/05*     (2006.01)
   *C08L 65/00*     (2006.01)
   *C08L 101/00*    (2006.01)

(52) U.S. Cl.
   CPC ........ *H01L 29/786* (2013.01); *H01L 51/0529* (2013.01); *H01L 51/052* (2013.01)

(56) References Cited

U.S. PATENT DOCUMENTS

| | | | | |
|---|---|---|---|---|
| 2009/0261321 | A1* | 10/2009 | Berens | H01L 51/0073 257/40 |
| 2014/0217395 | A1* | 8/2014 | Facchetti | H01L 29/7869 257/43 |
| 2015/0144846 | A1* | 5/2015 | Nanson | H01L 51/0036 252/500 |
| 2015/0255725 | A1* | 9/2015 | Mitchell | H01L 51/0035 528/380 |

\* cited by examiner

ORGANIC SEMICONDUCTOR ELEMENT, MANUFACTURING METHOD THEREOF, COMPOUND, COMPOSITION FOR FORMING ORGANIC SEMICONDUCTOR FILM, ORGANIC SEMICONDUCTOR FILM, AND MANUFACTURING METHOD THEREOF

CROSS-REFERENCE TO RELATED APPLICATIONS

This application is a Continuation of International Application No. PCT/JP2015/081176 filed on Nov. 5, 2015, which claims priority to Japanese Patent Application No. 2014-226657 filed on Nov. 7, 2014. The entire contents of these applications are incorporated herein by reference.

BACKGROUND OF THE INVENTION

1. Field of the Invention

The present invention relates to an organic semiconductor element, a manufacturing method thereof, a compound, a composition for forming an organic semiconductor film, an organic semiconductor film, and a manufacturing method thereof.

2. Description of the Related Art

An organic transistor having an organic semiconductor film (organic semiconductor layer) is used in a field effect transistor (FET) used in a liquid crystal display or an organic electroluminescence (EL) display, Radio Frequency Identifier (RFID, RF tag), and the like, because lightening of weight, cost reduction and flexibilization can be achieved.

As the organic semiconductor in the related art, those disclosed in JP2007-516315A and JP2013-57007A are known.

SUMMARY OF THE INVENTION

An object to be achieved by the present invention is to provide an organic semiconductor element having high mobility and excellent temporal stability under high humidity, and a manufacturing method thereof.

Another object to be achieved by the present invention is to provide a novel compound which is suitable as an organic semiconductor.

Still another object to be achieved by the present invention is to provide an organic semiconductor film having high mobility and excellent temporal stability under high humidity and a manufacturing method thereof, and a composition for forming an organic semiconductor film that can suitably form the organic semiconductor film.

The object of the present invention is solved by the means described in <1>, <6>, <12>, <14>, <19>, or <20> below. <2> to <5>, <7> to <11>, <13>, and <15> to <18> which are preferable embodiments are also described below.

<1> An organic semiconductor element comprising: an organic semiconductor layer containing a compound having a constitutional repeating unit represented by Formula 1,

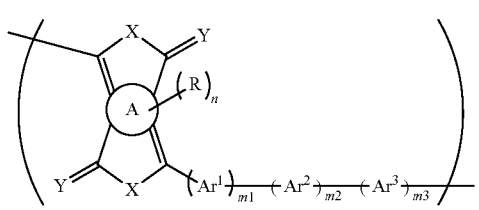

(1)

in Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

<2> The organic semiconductor element according to <1>, in which the constitutional repeating unit represented by Formula 1 above is a constitutional repeating unit represented by Formula 2,

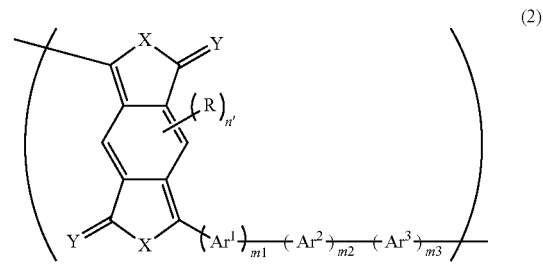

(2)

in Formula 2, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$ and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

<3> The organic semiconductor element according to <1> or <2>, in which X represents O, S, or NR.

<4> The organic semiconductor element according to any one of <1> to <3>, in which Y represents O or S.

<5> The organic semiconductor element according to any one of <1> to <4>, in which the constitutional repeating unit represented by Formula 1 above is a constitutional repeating unit represented by Formula 3,

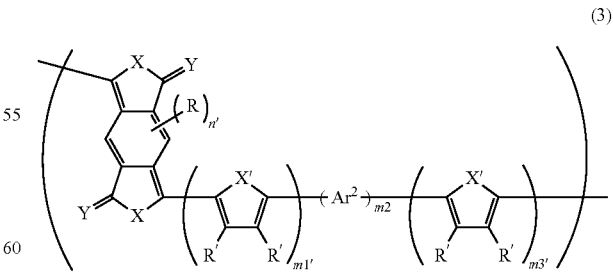

(3)

in Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^2$'s each independently represent an aromatic hydrocarbon group, an aromatic heterocyclic group, a vinylene group, or an ethynylene group, X"s each independently represent O or S, R"s each independently represent a hydrogen atom or an alkyl group, m1' and m3' each independently represent an integer of 0 to 2, m2 represents an integer of 0 to 4, and n' represents an integer of 0 to 2.

<6> A compound comprising: a constitutional repeating unit represented by Formula 1,

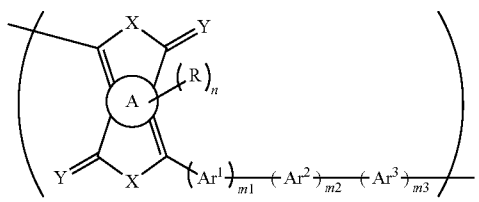

(1)

in Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms of an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

<7> The compound according to <6>, in which the constitutional repeating unit represented by Formula 1 above is a constitutional repeating unit represented by Formula 2,

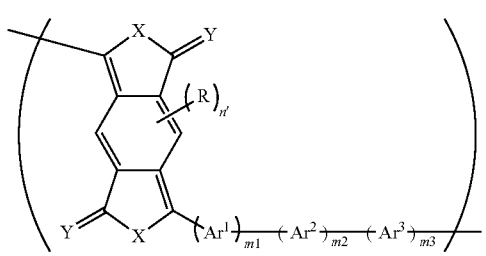

(2)

in Formula 2, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

<8> The compound according to <6> or <7>, in which X represents O, S, or NR.

<9> The compound according to any one of <6> to <8>, in which Y represents O or S.

<10> The compound according to any one of <6> to <9>, in which the constitutional repeating unit represented by Formula 1 above is a constitutional repeating unit represented by Formula 3,

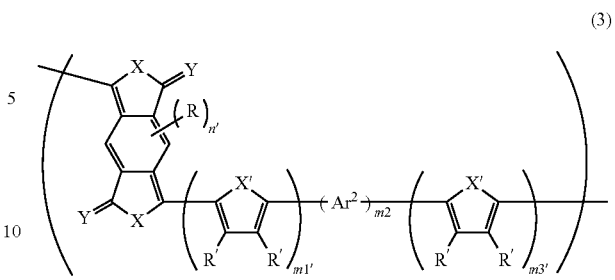

(3)

in Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^2$'s each independently represent an aromatic hydrocarbon group, an aromatic heterocyclic group, a vinylene group, or an ethynylene group, X"s each independently represent O or S, R"s each independently represent a hydrogen atom or an alkyl group, m1' and m3' each independently represent an integer of 0 to 2, m2 represents an integer of 0 to 4, and n' represents an integer of 0 to 2.

<11> The compound according to any one of <6> to <10>, which is an organic semiconductor compound.

<12> A composition for forming an organic semiconductor film, comprising: the compound according to any one of <6> to <11>; and a solvent.

<13> The composition for forming an organic semiconductor film according to <12>, further comprising: a binder polymer.

<14> An organic semiconductor film comprising: a compound having a constitutional repeating unit represented by Formula 1,

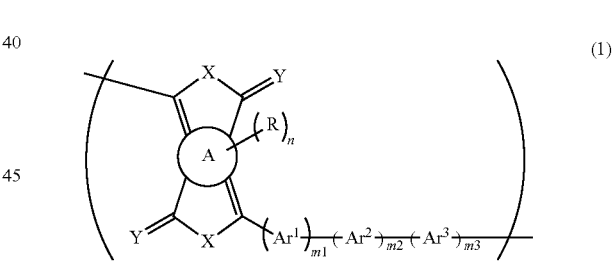

(1)

in Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms of an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

<15> The organic semiconductor film according to <14>, in which the constitutional repeating unit represented by Formula 1 above is a constitutional repeating unit represented by Formula 2,

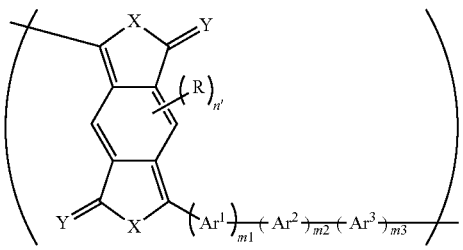

(2)

in Formula 2, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

<16> The organic semiconductor film according to <14> or <15>, in which X represents O, S, or NR.

<17> The organic semiconductor film according to any one of <14> to <16>, in which Y represents O or S.

<18> The organic semiconductor film according to any one of <14> to <17>, in which the constitutional repeating unit represented by Formula 1 above is a constitutional repeating unit represented by Formula 3,

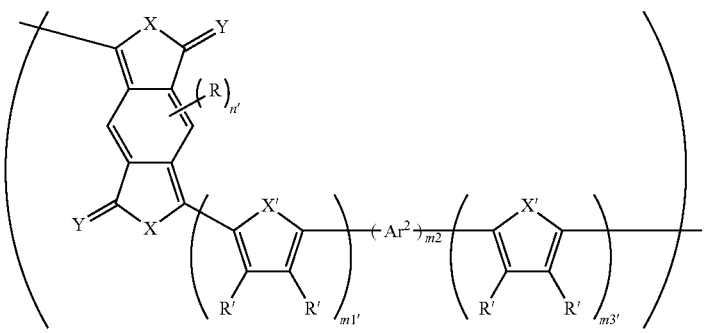

(3)

in Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^2$'s each independently represent an aromatic hydrocarbon group, an aromatic heterocyclic group, a vinylene group, or an ethynylene group, X"s each independently represent O or S, R"s each independently represent a hydrogen atom or an alkyl group, m1' and m3' each independently represent an integer of 0 to 2, m2 represents an integer of 0 to 4, and n' represents an integer of 0 to 2.

<19> A method of manufacturing an organic semiconductor film, comprising: a coating step of coating a substrate with the composition for forming an organic semiconductor film according to <12> or <13>.

<20> A method of manufacturing an organic semiconductor element, comprising: a coating step of coating a substrate with the composition for forming an organic semiconductor film according to <12> or <13>.

According to the present invention, it is possible to provide an organic semiconductor element having high mobility and excellent temporal stability under high humidity and a manufacturing method thereof.

According to the present invention, it is possible to provide a novel compound suitable for an organic semiconductor.

According to the present invention, it is possible to provide an organic semiconductor film having high mobility and excellent temporal stability under high humidity and a manufacturing method thereof, and a composition for forming an organic semiconductor film that can suitably form the organic semiconductor film.

DESCRIPTION OF THE PREFERRED EMBODIMENTS

Figure 1:
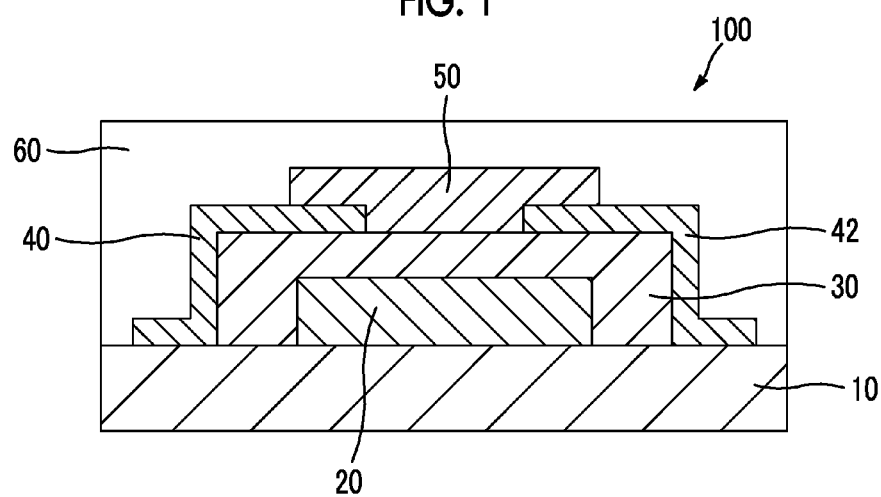
FIG. 1 is a schematic cross-sectional view of an aspect of an organic semiconductor element of the present invention.

Hereinafter, the contents of the present invention will be specifically described. The constituents in the following description will be explained based on typical embodiments of the present invention, but the present invention is not limited to the embodiments. In the specification of the present application, "to" is used to mean that the numerical values listed before and after "to" are a lower limit and an upper limit respectively.

In the present specification, in a case where there is no description regarding whether a group (atomic group) is substituted or unsubstituted, the group includes both of a group having a substituent and a group not having a substituent. For example, an "alkyl group" includes not only an alkyl group not having a substituent (unsubstituted alkyl group) but also an alkyl group having a substituent (substituted alkyl group).

In the present specification, in some cases, a chemical structural formula is described as a simplified structural formula in which a hydrogen atom is omitted.

In the present invention, "mobility" refers to "carrier mobility" and means either of both of electron mobility and hole mobility.

In the present invention, "mass %" and "weight %" have the same definition, and "part by mass" and "part by weight" have the same definition.

In the present invention, a combination of two or more preferred aspects is a more preferable aspect.

(Organic Semiconductor Element)

The organic semiconductor element according to the present invention has an organic semiconductor layer containing a compound that has a constitutional repeating unit represented by Formula 1.

The compound having the constitutional repeating unit represented by Formula 1 or 2 below is preferably an organic semiconductor compound.

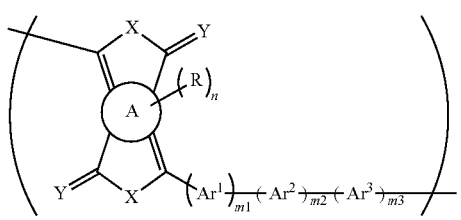

In Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms of an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

The inventors have diligently conducted research to find that, if the specific compound having a specific ring structure was contained, the obtained organic semiconductor element or the organic semiconductor film have high mobility, excellent heat resistance, and suppressed variation of mobility, such that the present invention has been completed.

<Compound Having Constitutional Repeating Unit Represented by Formula 1>

The organic semiconductor element according to the present invention has an organic semiconductor layer containing a compound having a constitutional repeating unit represented by Formula 1 above.

In Formula 1, X's each independently represent $CH_2$, CHR, $CR_2$, NR, O, S, Se, or $SiR_2$, R's each independently represent a monovalent substituent, and a plurality of R's may form rings.

In view of mobility, X's each independently and preferably represent O, S, or NR, more preferably O or S, and even more preferably O.

In view of mobility and synthesis, two X's in Formula 1 are preferably the same group.

R is preferably a group having 0 to 60 carbon atoms, more preferably a group having 2 to 50 carbon atoms, even more preferably a group having 3 to 40 carbon atoms, and particularly preferably a group having 4 to 30 carbon atoms.

R's in CHR and $CR_2$ of X above each independently and preferably represent an alkyl group, an aromatic hydrocarbon group, or an aromatic heterocyclic group, more preferably an alkyl group, and even more preferably a linear or branched alkyl group having 8 to 40 carbon atoms. Two R's in $CR_2$ of X above may be bonded to each other to form a ring.

R in NR of X above is preferably an alkyl group, an alkenyl group, an alkynyl group, an aromatic hydrocarbon group, or an aromatic heterocyclic group, more preferably an alkyl group, and even more preferably a linear or branched alkyl group having 8 to 40 carbon atoms.

R in $SiR_2$ of X above is preferably an alkyl group, an alkenyl group, an alkynyl group, an aromatic hydrocarbon group, or an aromatic heterocyclic group, more preferably an alkyl group, and even more preferably a linear or branched alkyl group having 8 to 40 carbon atoms. Two R's in $SiR_2$ of X above may be bonded to each other to form a ring.

An alkyl group, an alkenyl group, an alkynyl group, an aromatic hydrocarbon group, and an aromatic heterocyclic group in R above may further have a substituent. Examples of the substituent include a silyl group (including an oligosiloxane group), a halogen atom, an alkyl group, an aromatic hydrocarbon group, and an aromatic heterocyclic group.

In Formula 1, Y's each independently represent O, S, N—CN, or $CQ_2$, and Q represents CN, $CF_3$, COR, COOR, or $SO_2R$.

In view of mobility, Y's each independently and preferably represent O or S and more preferably O.

R in COR, COOR, or $SO_2R$ of Q above is preferably an alkyl group, an alkenyl group, an alkynyl group, an aromatic hydrocarbon group, or an aromatic heterocyclic group and more preferably an alkyl group or an aromatic hydrocarbon group. In a case where any of two Q's of $CQ_2$ above is COR, COOR, or $SO_2R$, two R's may be bonded to each other to form a ring.

The ring A represents an unsaturated hydrocarbon ring or a group obtained by substituting some of the carbon atoms of an unsaturated hydrocarbon ring with nitrogen atoms and n represents an integer of 0 to 6.

n items of R's bonded to the ring A each independently and preferably are an alkyl group, an alkenyl group, an alkynyl group, an aromatic hydrocarbon group, or an aromatic heterocyclic group, more preferably an alkyl group or an aromatic hydrocarbon group, even more preferably an aromatic hydrocarbon group, and particularly preferably an aromatic hydrocarbon group having 6 to 20 carbon atoms.

n is preferably an integer of 0 to 2 and more preferably 0.

The ring A is preferably a monocyclic ring or a fused ring having two or three rings and more preferably a structure presented below.

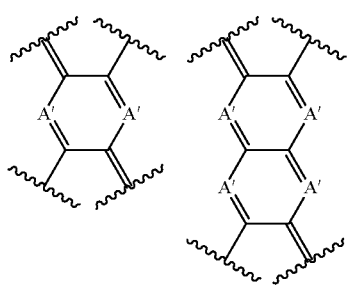

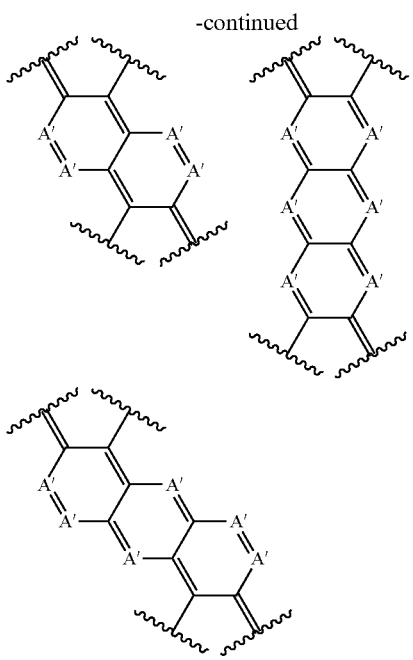

In the structure above, A"s each independently represent N, CH, or CR, R's each independently represent a monovalent substituent, and a wavy line part represents a position bonded to another structure.

A"s each independently and preferably represent N or CH and more preferably CH.

R in CR above has the same meaning as R bonded to the ring A of Formula 1 above and the preferable aspect thereof is the same.

$Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, and m2 represents an integer of 0 to 4.

$Ar^1$ and $Ar^3$ each independently and preferably represent an aromatic hydrocarbon group or an aromatic heterocyclic group, more preferably a monocyclic aromatic hydrocarbon group or a monocyclic aromatic heterocyclic group, and even more preferably a monocyclic aromatic heterocyclic group.

The aromatic hydrocarbon group is preferably an arylene group having 6 to 20 carbon atoms, more preferably a phenylene group or a naphthylene group, and even more preferably a phenylene group.

The heteroatom of the aromatic heterocyclic group is not particularly limited. However, S, O, N, and Se are exemplified.

Specifically, the aromatic heterocyclic group is preferably a group obtained by removing two hydrogen atoms from an aromatic hetero ring selected from the group consisting of a thiophene ring, a furan ring, a pyran ring, a pyrrole ring, a pyridine ring, a pyrazine ring, a pyrimidine ring, a pyridazine ring, a selenophene ring, an imidazole ring, and a thienothiophene ring, more preferably a group obtained by removing two hydrogen atoms from an aromatic hetero ring selected from the group consisting of a thiophene ring, a furan ring, a pyrrole ring, a pyridine ring, a selenophene ring, and a thienothiophene ring, even more preferably a group obtained by removing two hydrogen atoms from a thiophene ring or a furan ring, and particularly preferably a group obtained by removing two hydrogen atoms from a thiophene ring.

$Ar^1$ and $Ar^3$ are most preferably a group obtained by removing two hydrogen atoms from a phenylene group or a thiophene ring.

The aromatic hydrocarbon group or the aromatic heterocyclic group may have a substituent. Examples of the preferable substituent include a halogen atom or an alkyl group. The alkyl group is preferably an alkyl group having 1 to 20 carbon atoms and more preferably an alkyl group having 8 to 20 carbon atoms. The alkyl group may have a substituent and examples of the substituent include a halogen atom.

In view of manufacturing suitability, it is preferable that $Ar^1$ and $Ar^3$ are identical to each other.

$Ar^2$'s each independently represent an aromatic hydrocarbon group, an aromatic heterocyclic group, a vinylene group, or an ethynylene group.

The aromatic hydrocarbon group is preferably an arylene group having 6 to 20 carbon atoms and preferably a group obtained by removing two hydrogen atoms from a phenylene group, a naphthylene group, or an anthracene ring.

The heteroatom of the aromatic hetero ring is not particularly limited, and examples thereof include S, O, N, Se, and Si. Examples of the aromatic heterocyclic group include a group obtained by removing two hydrogen atoms from a ring selected from the group consisting of a thiophene ring, a furan ring, a pyran ring, a pyrrole ring, a pyridine ring, a pyrazine ring, a pyrimidine ring, a pyridazine ring, a selenophene ring, an imidazole ring, and a thienothiophene ring. The aromatic heterocyclic group is preferably a group obtained by removing two hydrogen atoms from a ring selected from the group consisting of a thiophene ring, a furan ring, a pyrrole ring, a pyridine ring, a selenophene ring, and a thienothiophene ring, more preferably a group obtained by removing two hydrogen atoms from a ring selected from the group consisting of a thiophene ring and a thienothiophene ring, and even more preferably a group obtained by removing two hydrogen atoms from a thiophene ring.

The aromatic hydrocarbon group or the aromatic heterocyclic group each may have a substituent. Examples of the preferable substituent include an alkyl group, and the preferable substituent is preferably an alkyl group having 1 to 40 carbon atoms, more preferably an alkyl group having 4 to 30 carbon atoms, and even more preferably an alkyl group of 8 to 20 carbon atoms.

$Ar^2$ is preferably a polycyclic aromatic hydrocarbon group, a polycyclic aromatic heterocyclic group, a vinylene group, or an ethynylene group.

The polycyclic aromatic hydrocarbon group and the polycyclic aromatic heterocyclic group each preferably have a fused polycyclic ring structure of two to eight rings and more preferably have a fused polycyclic ring structure of two to five rings.

The polycyclic aromatic hydrocarbon group is preferably a group obtained by removing two hydrogen atoms from a naphthylene group and an anthracene ring or a group obtained by removing two hydrogen atoms from a pyrene ring.

The polycyclic aromatic heterocyclic group is preferably a structure represented by any one of Formulae AR-1 to AR-11 below.

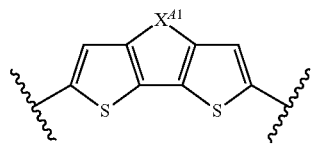
(AR-1)

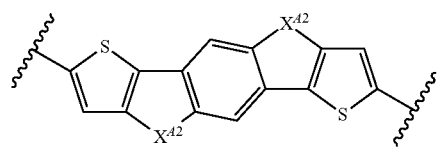
(AR-2)

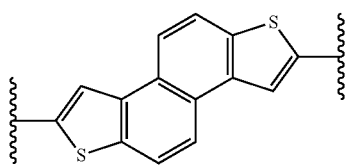
(AR-3)

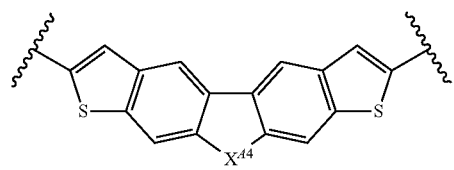
(AR-4)

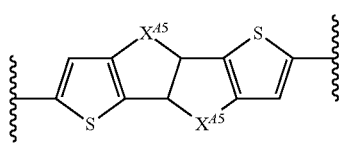
(AR-5)

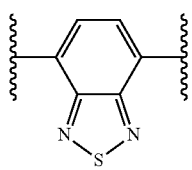
(AR-6)

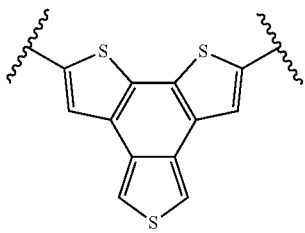
(AR-7)

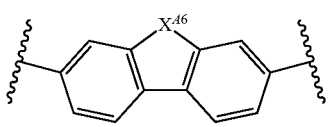
(AR-8)

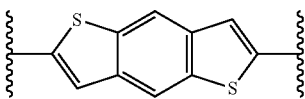
(AR-9)

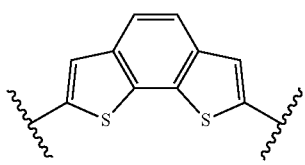
(AR-10)

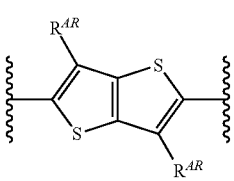
(AR-11)

In Formulae AR-1 to AR-11, $X^{A1}$, $X^{A2}$, $X^{A4}$, and $X^{A5}$ each independently represent any one of S, Se, O, $CR^{AR}_2$, $NR^{AR}$, and $SiR^{AR}_2$, and $R^{AR}$'s each independently represent a monovalent organic group.

$R^{AR}$'s each independently represent an alkyl group having 8 to 20 carbon atoms. Among these, the polycyclic aromatic heterocyclic group is preferably a group represented by any one of Formulae AR-1 to AR-5 and Formulae AR-9 to AR-11, more preferably a group represented by any one of Formulae AR-1, AR-2, AR-4, AR-5, AR-9, and AR-11, and even more preferably a group represented by any one of Formulae AR-1, AR-2, AR-4, AR-5, and AR-11.

The polycyclic aromatic hydrocarbon group or the polycyclic aromatic heterocyclic group may have a substituent. Examples of the preferable substituent include an alkyl group, an alkyl group having 1 to 40 carbon atoms is preferable, an alkyl group having 4 to 30 carbon atoms is more preferable, and an alkyl group having 8 to 20 carbon atoms is even more preferable.

In Formula 1, m1 and m3 each independently represent an integer of 0 to 2 and m2 represents an integer of 0 to 4.

The sum of m1, m2, and m3 is preferably 1 or greater, more preferably 2 or greater, and even more preferably 3 or greater. In view of the synthesis, the sum is preferably 7 or less, more preferably 6 or less, and even more preferably 5 or less.

In a case where Ar² is a vinylene group or an ethynylene group, m1 and m3 each independently and preferably represent 1 or 2.

In a case where Ar² is a polycyclic aromatic hydrocarbon group or a polycyclic aromatic heterocyclic group, m2 is preferably 1 to 3 and more preferably 1, and m1 and m3 each independently and preferably represent 0 or 1.

The constitutional repeating unit represented by Formula 1 preferably has at least one alkyl group having 8 to 40 carbon atoms, more preferably has at least one alkyl group having 10 to 40 carbon atoms, and even more preferably has at least one alkyl group having 12 to 40 carbon atoms. If the constitutional repeating unit has an alkyl group having 8 or greater carbon atoms, it is possible to form an organic semiconductor film having excellent solubility and excellent mobility. In Formula 1, the alkyl group may be R or $Ar^1$ to $Ar^3$ may have the alkyl group as a substituent, but the present invention is not limited thereto.

The constitutional repeating unit represented by Formula 1 is preferably a constitutional repeating unit represented by any one of Formulae 1-A to 1-E.

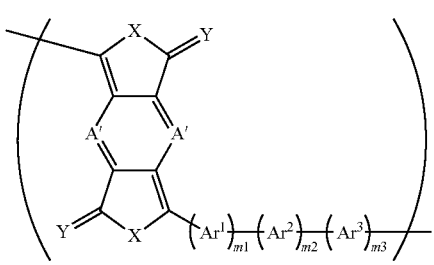

(1-A)

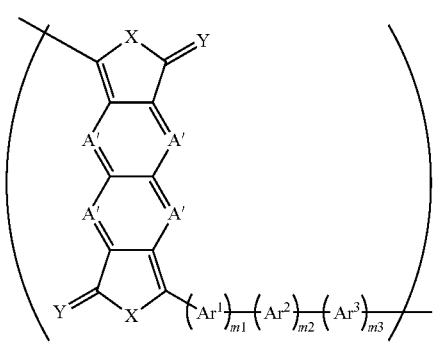

(1-B)

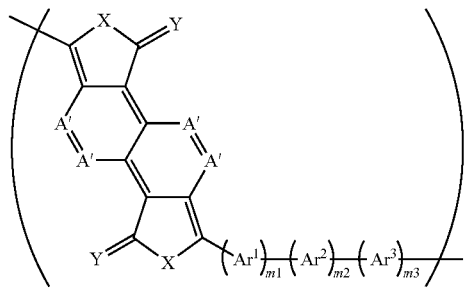

(1-C)

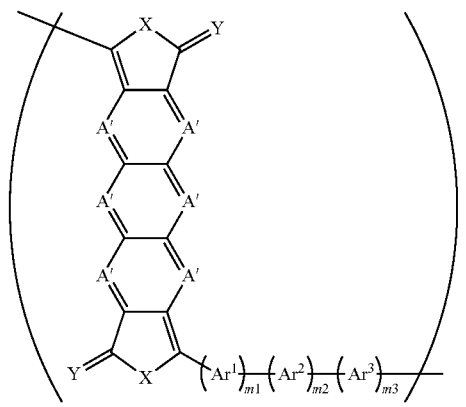

(1-D)

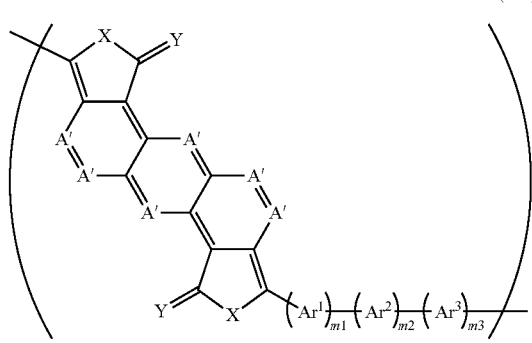

(1-E)

In Formulae 1-A to 1-E, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, A″'s each independently represent N, CH, or CR, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, and m2 represents an integer of 0 to 4.

X, Y, R, $Ar^1$ to $Ar^3$, and m1 to m3 in Formulae 1-A to 1-E have the same meaning as X, Y, R, $Ar^1$ to $Ar^3$, and m1 to m3 in Formula 1, and preferable ranges thereof are also the same.

A″s each independently and preferably represent N or CH and more preferably CH.

The constitutional repeating unit represented by Formula 1 above is preferably a constitutional repeating unit represented by any one of Formula 2, and Formulae 2-A to Formula 2-D below and more preferably a constitutional repeating unit represented by Formula 2 below.

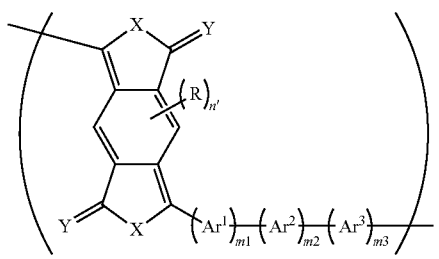

(2)

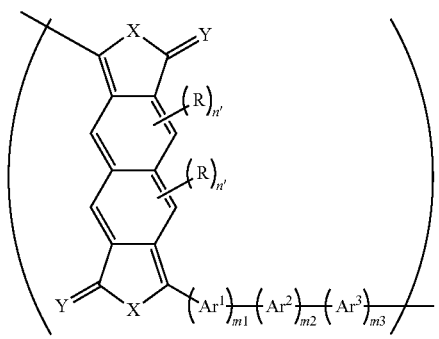

(2-A)

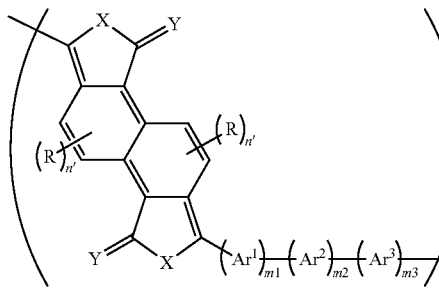

(2-B)

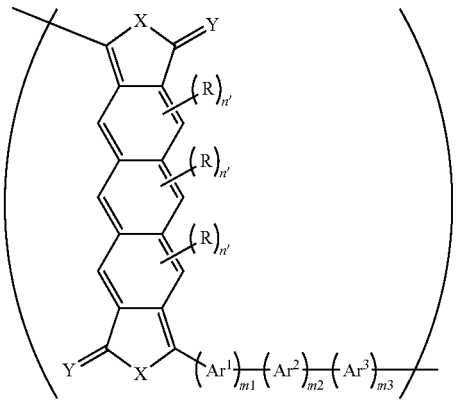

(2-C)

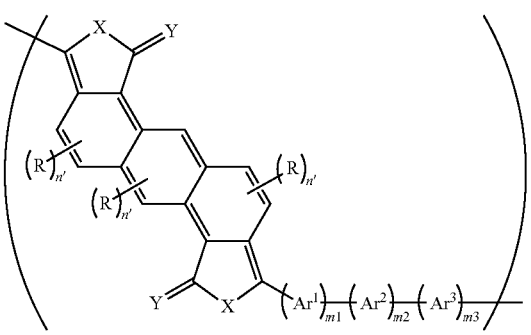

(2-D)

In Formula 2 and Formulae 2-A to 2-D, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

X, Y, R, $Ar^1$ to $Ar^3$, and m1 to m3 in Formula 2 and Formulae 2-A to 2-D may be the same as X, Y, R, $Ar^1$ to $Ar^3$, and m1 to m3 in Formula 1, and preferable ranges thereof are also the same.

n' is preferably 0.

The constitutional repeating unit represented by Formula 1 above is particularly preferably a constitutional repeating unit represented by Formula 3 below.

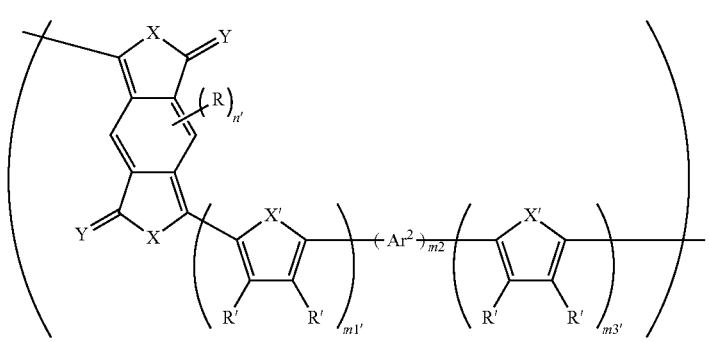

(3)

In Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^2$'s each independently represent an aromatic hydrocarbon group, an aromatic heterocyclic group, a vinylene group, or an ethynylene group, X"s each independently represent O or S, R"s each independently represent a hydrogen atom or an alkyl group, m1' and m3' each independently represent an integer of 0 to 2, m2 represents an integer of 0 to 4, and n' represents an integer of 0 to 2.

X, Y, R, $Ar^2$, and m2 in Formula 3 have the same meaning as X, Y, R, $Ar^2$, and m2 in Formula 1 and preferable ranges thereof are also the same.

X' is preferably S.

It is preferable that m1' and m3' each are 0 or 1, it is more preferable that the both are 0 or 1, and it is even more preferable that the both are 1.

R"s each independently represent a hydrogen atom or an alkyl group, preferably a hydrogen atom or an alkyl group having 8 to 20 carbon atoms, and more preferably a hydrogen atom.

n' is preferably 0.

In the specific compound, the content of the constitutional repeating unit represented by Formula 1 is preferably 60 to 100 mass %, more preferably 80 to 100 mass %, and even more preferably 90 to 100 mass % with respect to the total mass of the specific compound. It is particularly preferable that the constitutional repeating unit is substantially formed only with the constitutional repeating unit represented by Formula 1. The expression "the constitutional repeating unit is substantially formed only with the constitutional repeating unit represented by Formula 1 or 2" means that the content of the constitutional repeating unit represented by Formula 1 is 95 mass % or greater, preferably 97 mass % or greater, and more preferably 99 mass % or greater.

If the content of the constitutional repeating unit represented by Formula 1 is in the range above, an organic semiconductor having excellent mobility can be obtained.

The specific compound is a compound having two or more constitutional repeating units represented by Formula 1 and may be an oligomer in which the number "n" of constitutional repeating units is two to nine or may be a polymer in which the number "n" of constitutional repeating units is 10 or greater. Among these, a polymer in which the number "n" of constitutional repeating units is 10 or greater is preferable, in view of mobility and obtainable physical properties of the organic semiconductor film.

The weight-average molecular weight of the specific compound is not particularly limited. However, in view of mobility and film quality stability of a thin film, the weight-average molecular weight is preferably 1,000 or greater, more preferably 10,000 or greater, even more preferably 50,000 or greater, and particularly preferably 70,000 or greater. In view of solubility to the solvent, the weight-average molecular weight is preferably 2,000,000 or less, more preferably 1,000,000 or less, even more preferably 500,000 or less, and particularly preferably 250,000 or less.

If the weight-average molecular weight in the range above, solubility of the solvent and the film quality stability are compatible with each other.

According to the present invention, a weight-average molecular weight and a number-average molecular weight are measured by a gel permeation chromatography method (GPC method) and can be obtained in terms of standard polystyrene. Specifically, for example, HLC-8220GPC (manufactured by manufactured by Tosoh Corporation) is used as GPC, three of TSKgeL SuperHZM-H, TSKgeL SuperHZ4000, TSKgeL SuperHZ2000 (manufactured by Tosoh Corporation, 4.6 mmID×15 cm) are used as columns, and THF (tetrahydrofuran) is used as an eluent. As the condition, the sample concentration is set as 0.35 mass %, a flow rate is set as 0.35 ml/min, a sample injection volume is set as 10 μl, a measurement temperature is set as 40° C., and an IR detector was used, so as to perform gel permeation chromatography. A calibration curve is manufactured from eight samples of "standard sample TSK standard, polystyrene": "F-40", "F-20", "F-4", "F-1", "A-5000", "A-2500", "A-1000", and "n-propylbenzene" manufactured by Tosoh Corporation.

In an organic semiconductor layer described below, and an organic semiconductor film or a composition for forming an organic semiconductor film described below, only one specific compound may be included, and two or more types of the specific compounds may be included. However, in view of alignment and mobility, only one type is preferable.

The structure of a terminal of the compound having the constitutional repeating unit represented by Formula 1 is not particularly limited and depends on whether another constitutional unit exists, types of base material used in the synthesization, types of quenching agent (reaction terminator) at the time of synthesis. Examples thereof include a hydrogen atom, a hydroxy group, a halogen atom, an ethylenically unsaturated group, and an alkyl group.

Hereinafter, preferable specific examples of the preferable constitutional repeating unit represented by Formula 1 are provided, but the present invention is not limited to the examples below.

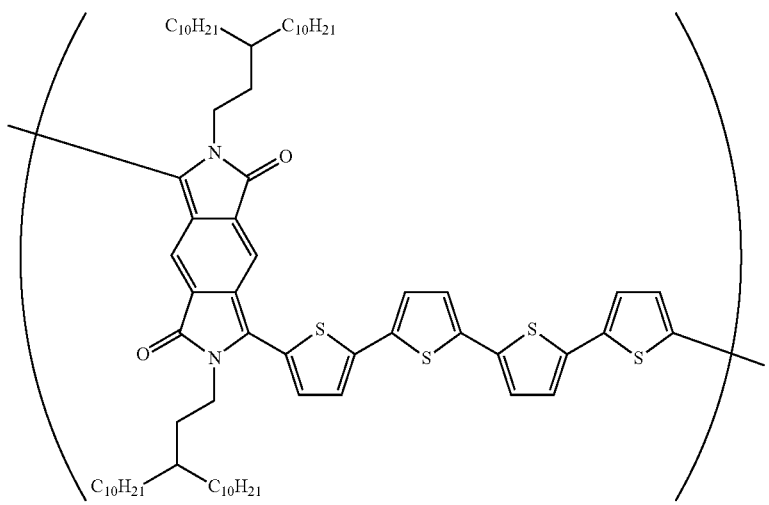
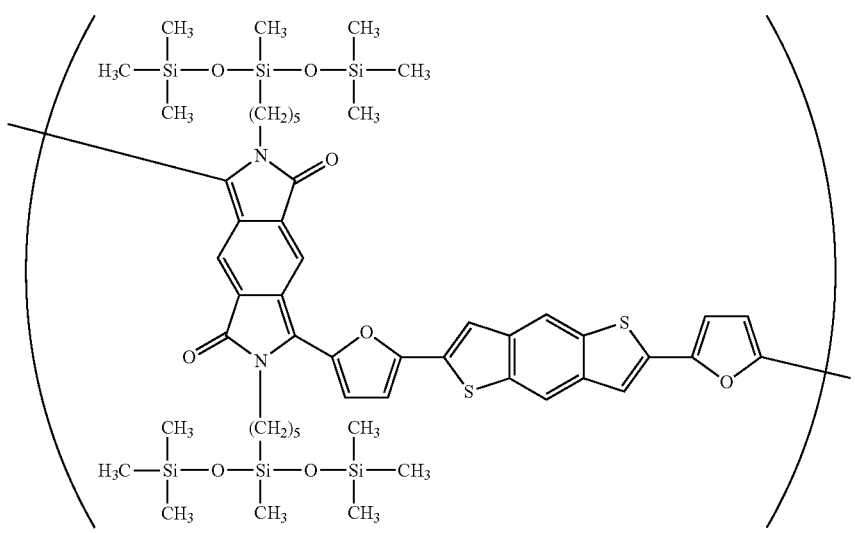
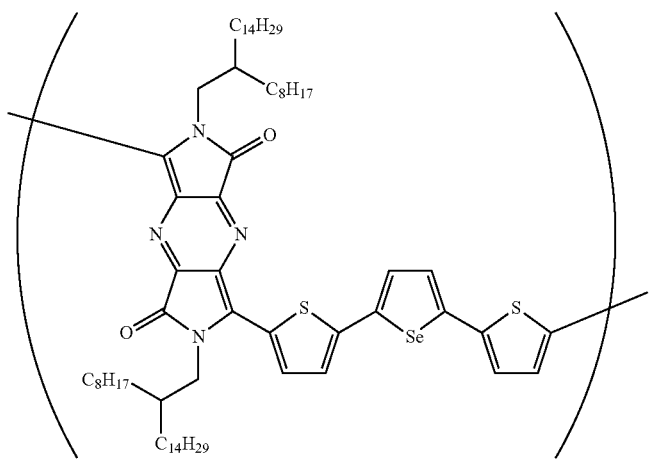

-continued
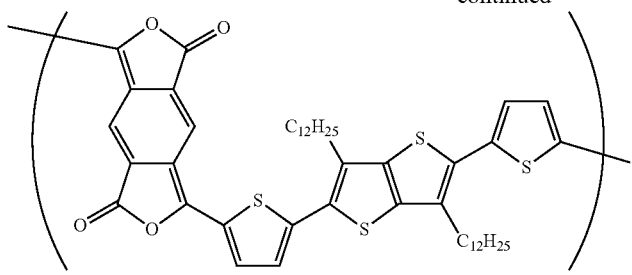
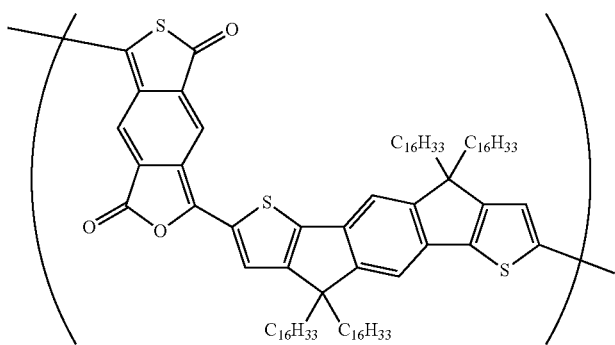
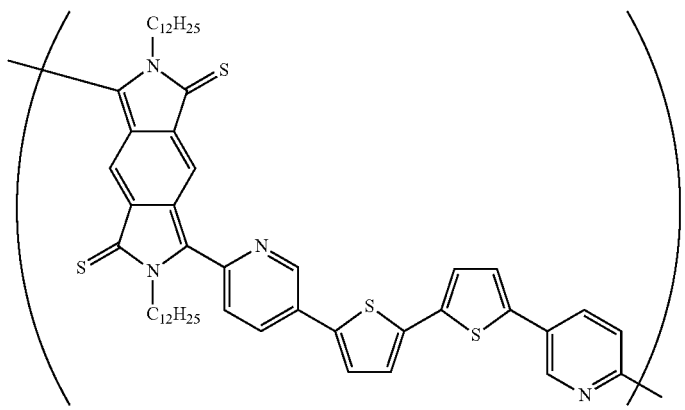
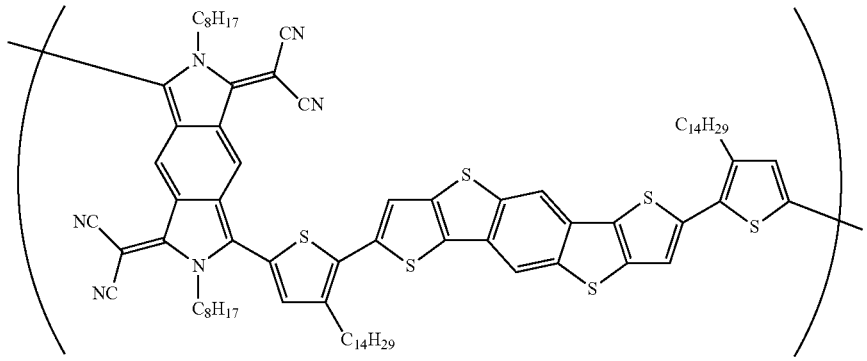

-continued
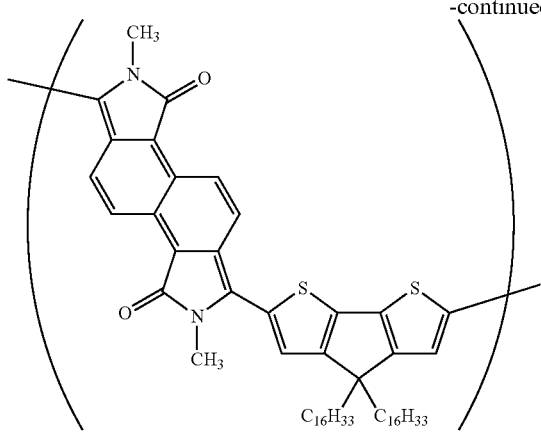
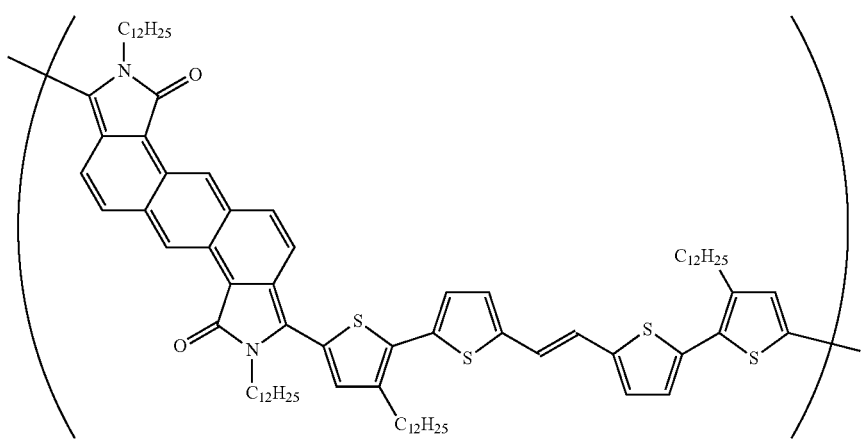
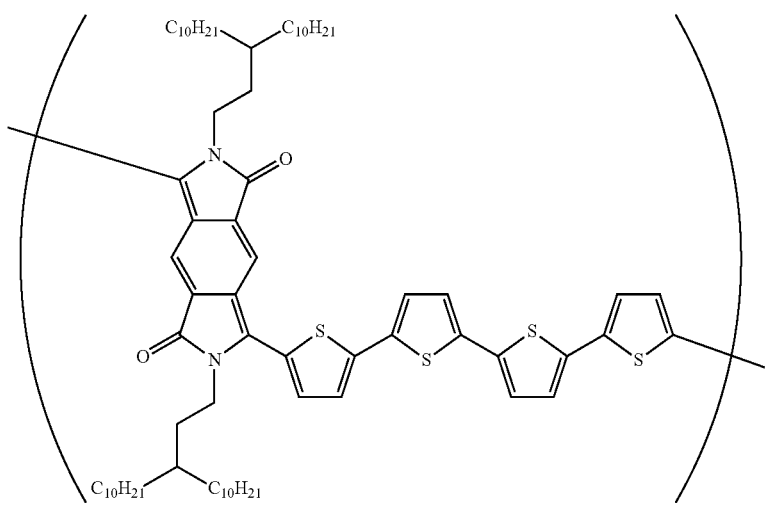

-continued
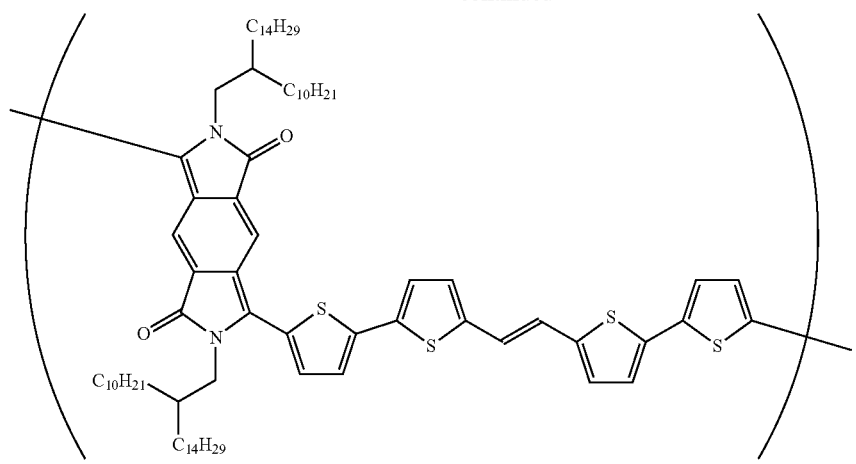
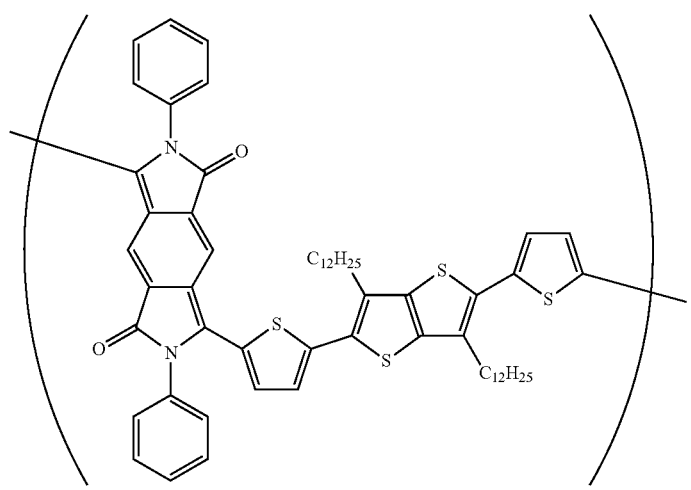
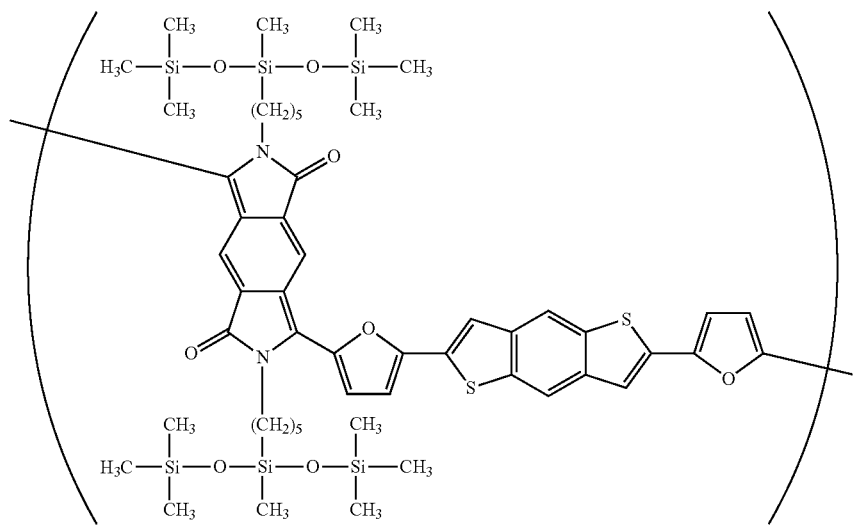

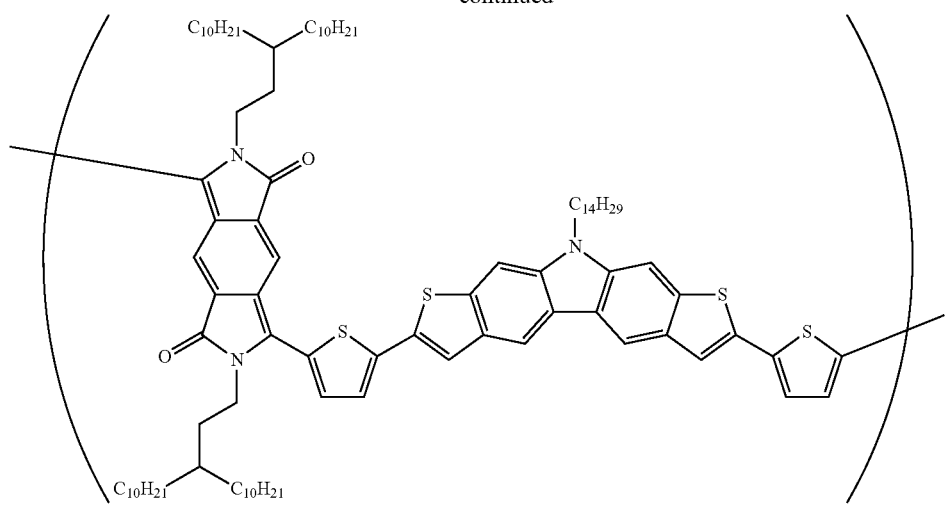
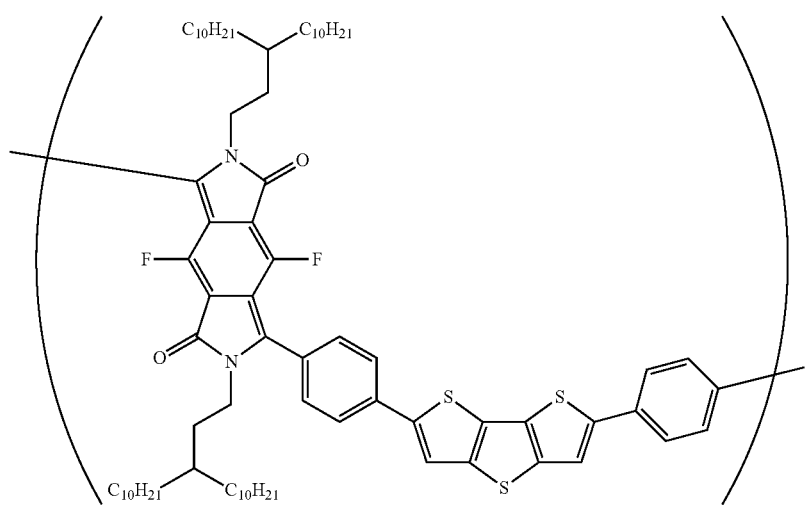
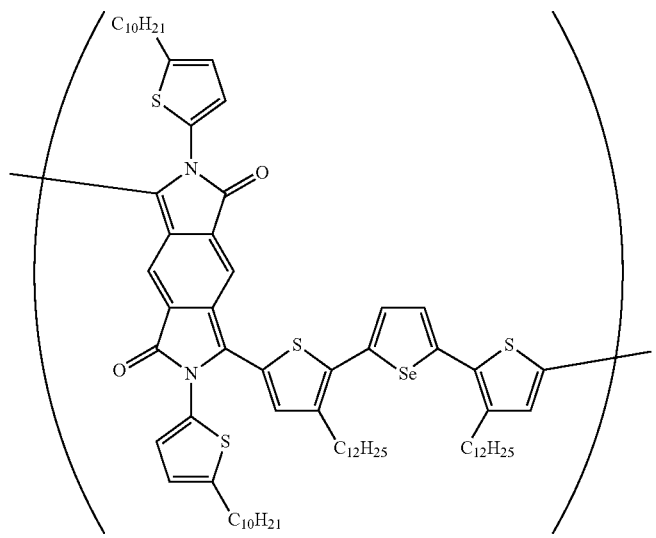

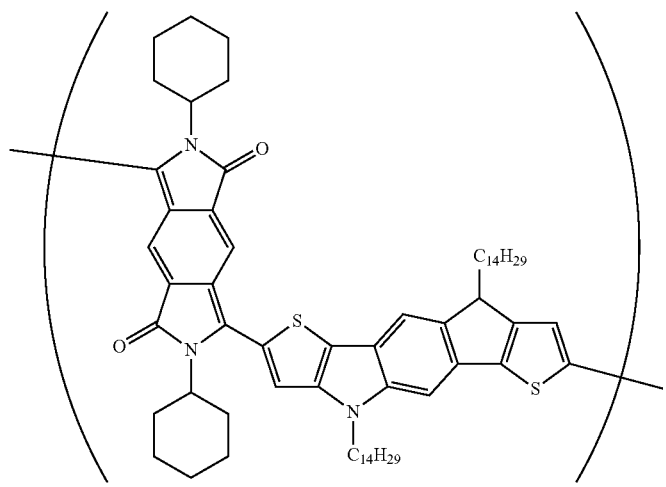
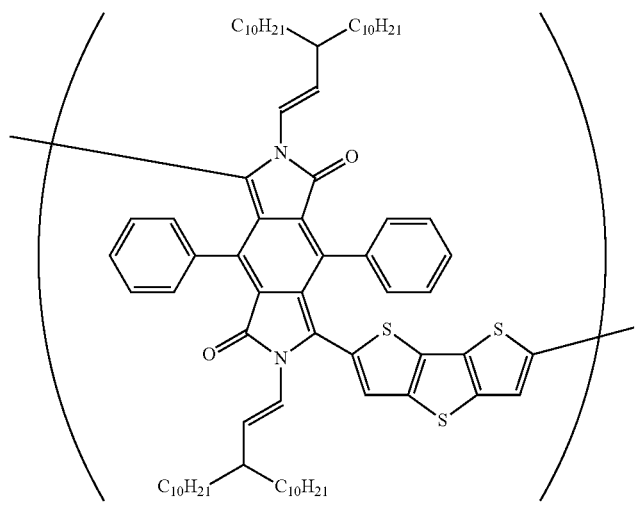
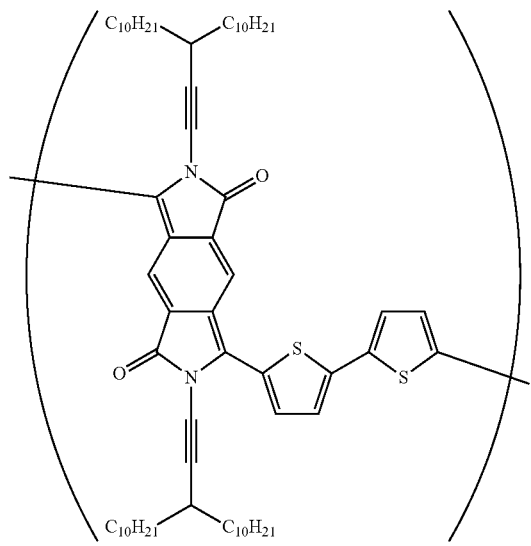

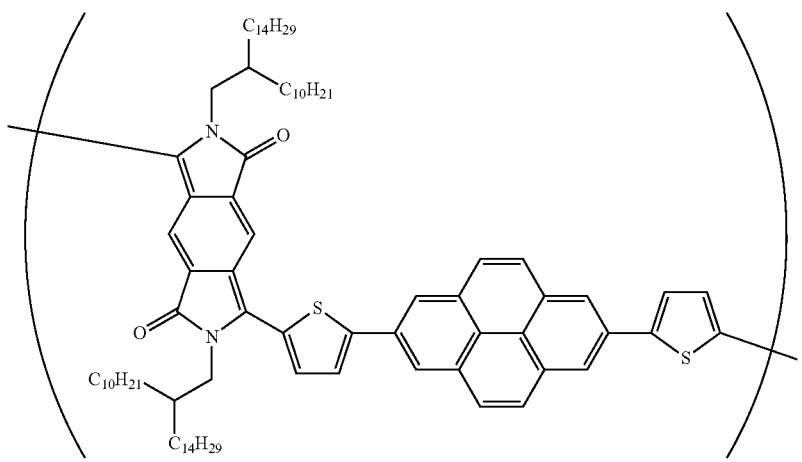
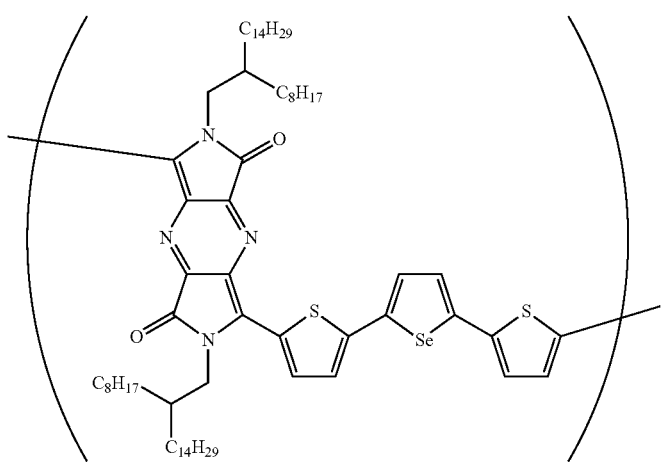
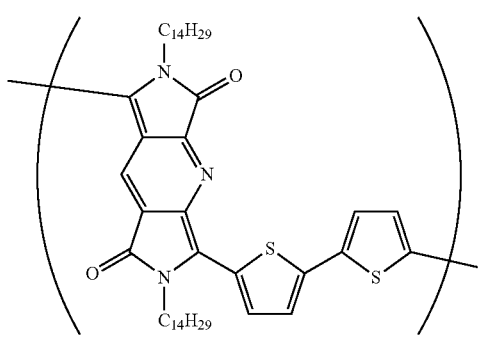
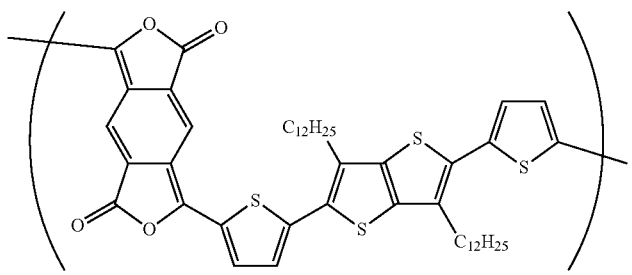

-continued
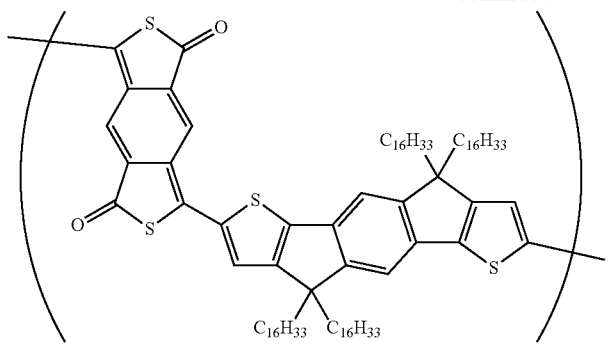
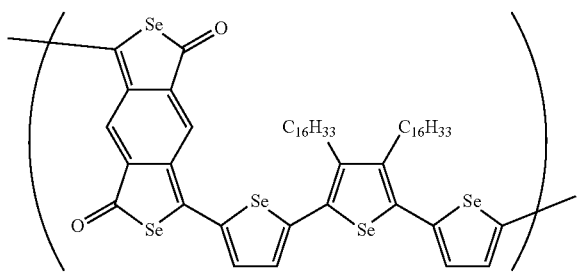
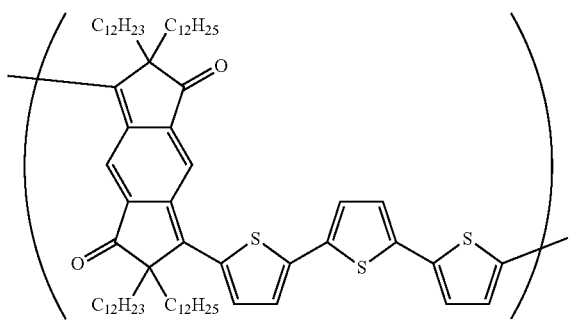
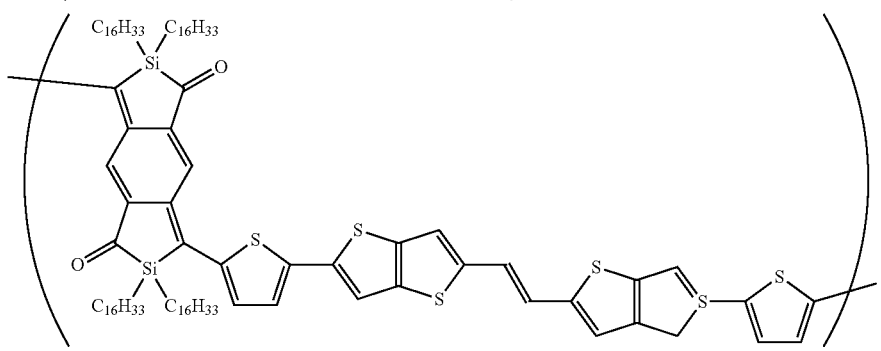
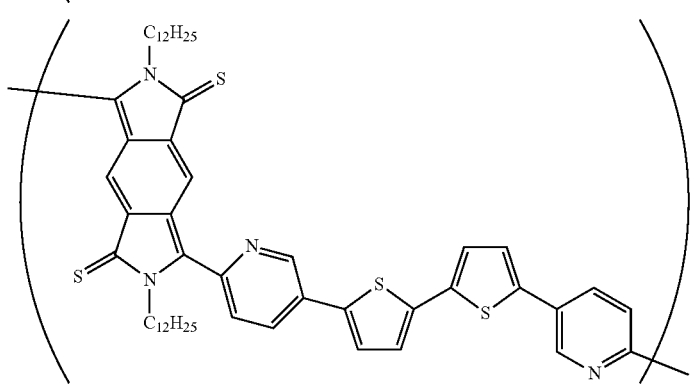

-continued
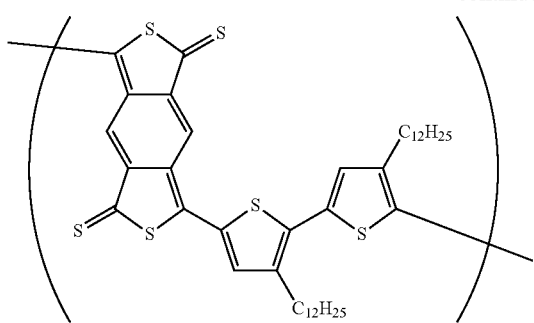
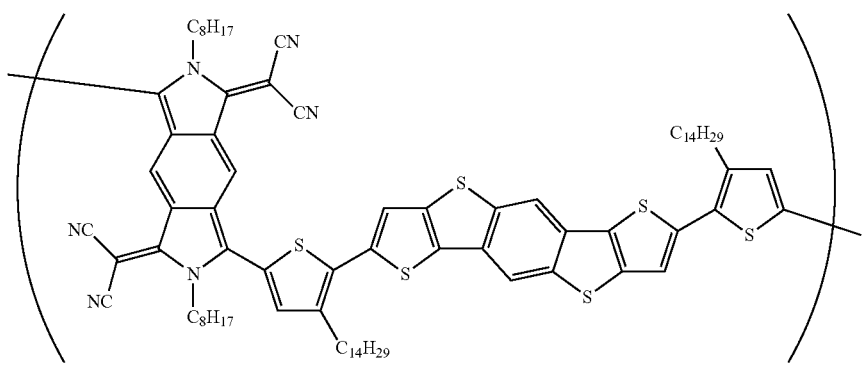
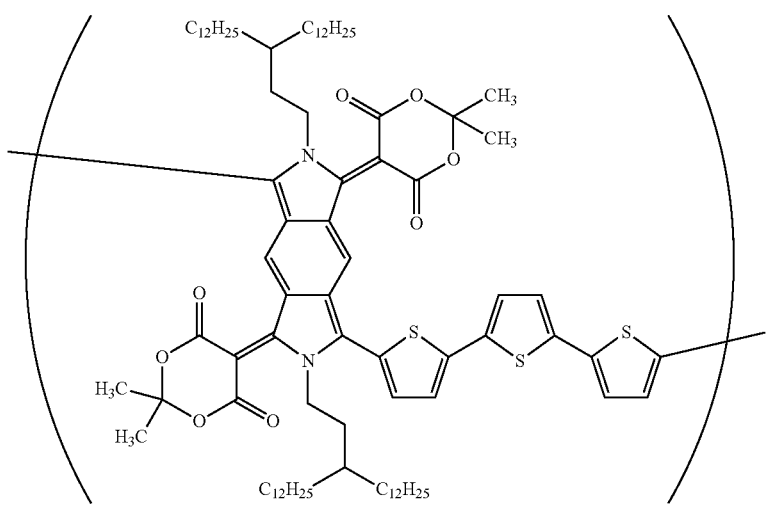
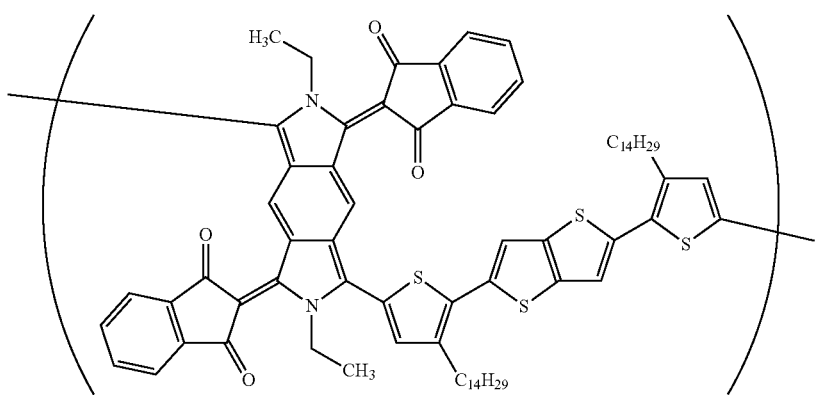

-continued
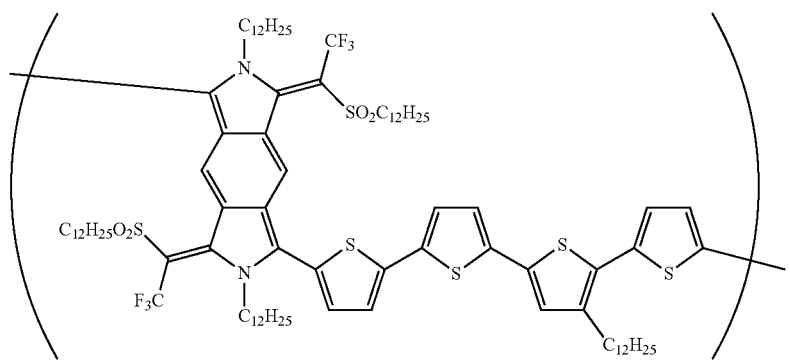
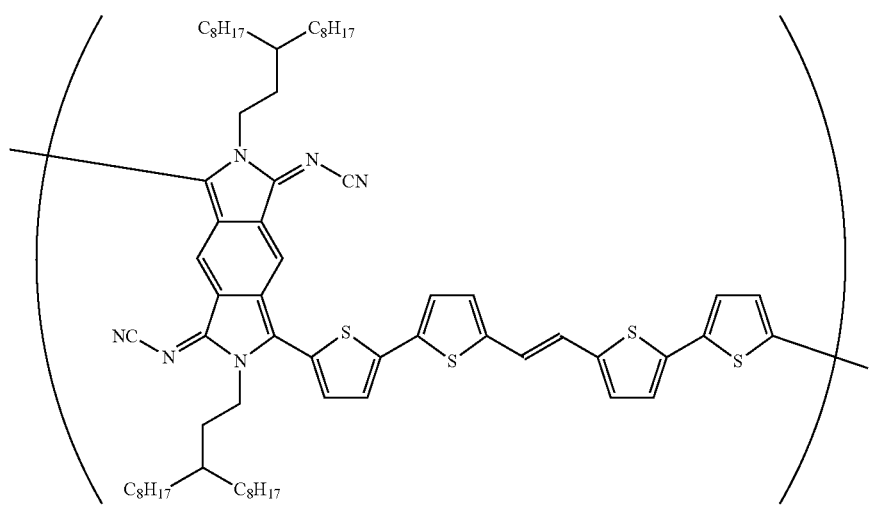
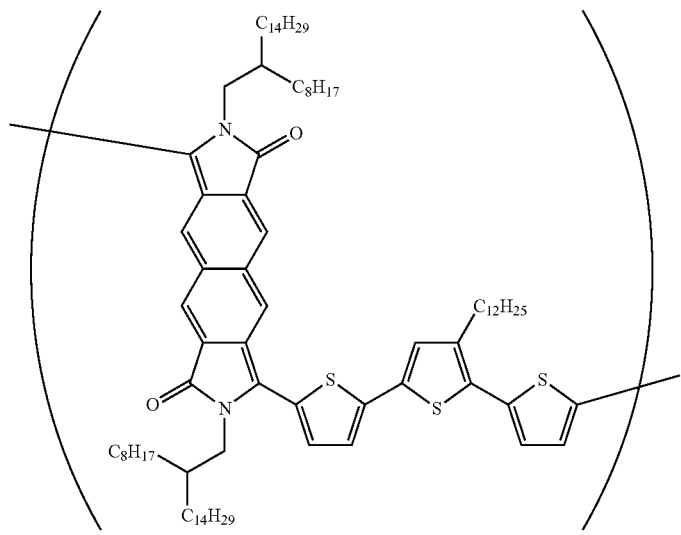

-continued

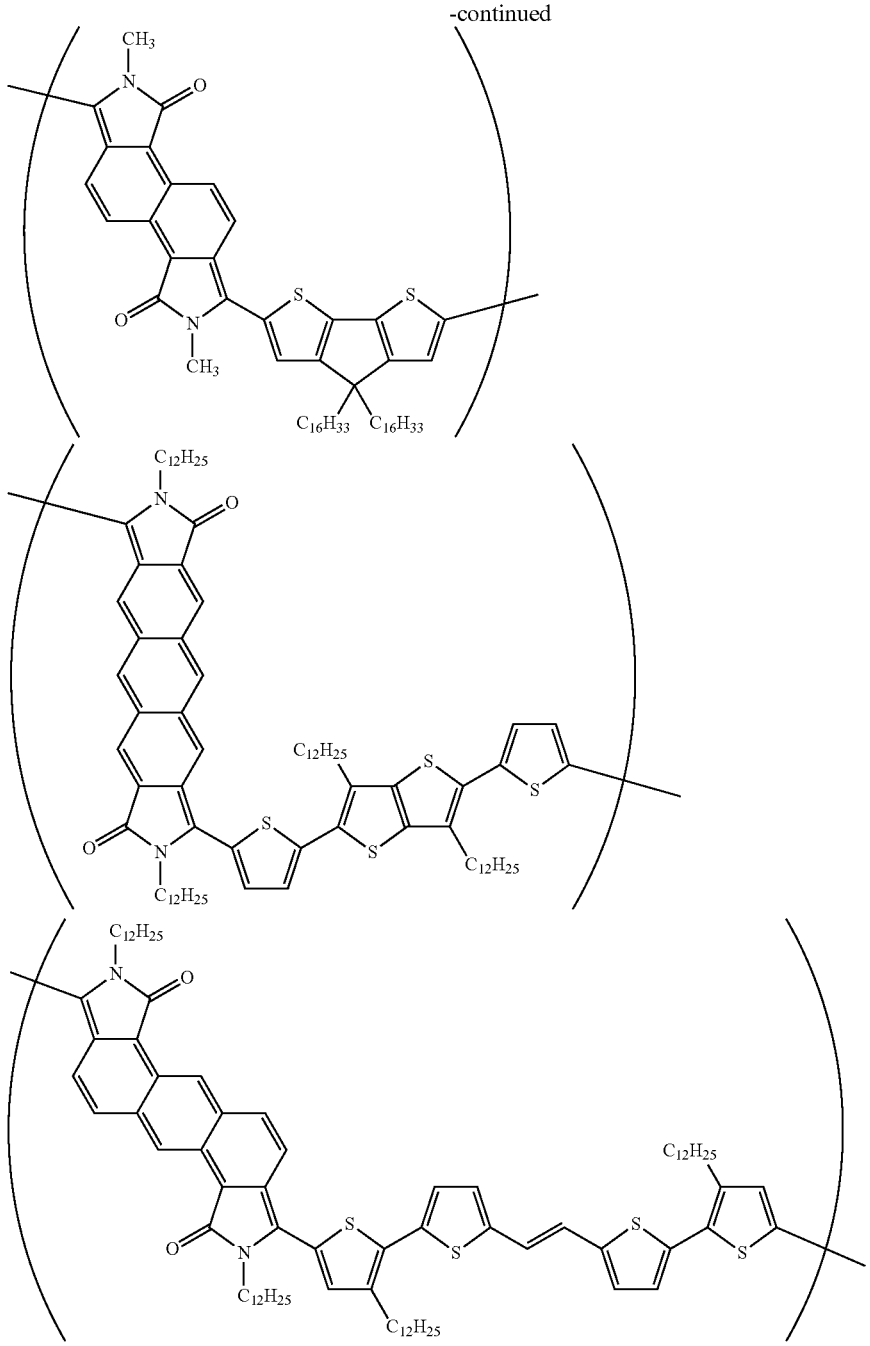

A method of synthesizing the specific compound is not particularly limited, and the synthesis is performed by well-known methods. For example, the specific compound can be synthesized by coupling reaction with an aromatic hydrocarbon ring and/or an aromatic hetero ring in which a transition metal catalyst is used. For example, the specific compound can be synthesized with reference to JP2014-82473A, JP2007-516315A, and JP2013-57007A.

<Binder Polymer>

The organic semiconductor layer of the organic semiconductor element according to the present invention preferably contains the binder polymer.

The organic semiconductor element according to the present invention may be an organic semiconductor element having a layer including the organic semiconductor layer and the binder polymer.

The types of the binder polymer are not particularly limited, and well-known binder polymers can be used.

Examples of the binder polymer include polystyrene, poly(α-methylstyrene), polyvinylcinnamate, poly(4-vinylphenyl), and poly(4-methyl styrene).

Examples of the binder polymer includes insulating polymers such as polystyrene, polycarbonate, polyarylate, polyester, polyamide, polyimide, polyurethane, polysiloxane, polysulfone, polymethyl methacrylate, polymethyl acrylate, cellulose, polyethylene, and polypropylene, and copolymers thereof, a semiconductor polymer such as polysilane, polycarbazole, polyarylamine, polyfluorene, polythiophene, polypyrrole, polyaniline, polyparaphenylenevinylene, polyacene, and polyheteroacene, and copolymers thereof, and rubber, and a thermoplastic elastomer.

Among these, as the binder polymer, a polymer compound (a polymer having a monomer unit having a benzene ring group) having a benzene ring is preferable. The content of the monomer unit having a benzene ring group is not particularly limited. However, the content is preferably 50 mol % or greater, more preferably 70 mol % or greater, and even more preferably 90 mol % or greater with respect to the entire monomer unit. The upper limit is not particularly limited, but examples of the upper limit include 100 mol %.

Examples of the binder polymer include polystyrene, poly($\alpha$-methylstyrene), polyvinyl cinnamate, poly(4-vinylphenyl), poly(4-methyl styrene), poly[bis(4-phenyl) (2,4,6-trimethylphenyl)amine], and poly[2,6-(4,4-bis(2-ethylhexyl)-4H cyclopenta[2,1-b;3,4-b']dithiophene)-alt-4,7-(2,1,3-benzothiadiazole)], and poly($\alpha$-methyl styrene) is particularly preferable.

A weight-average molecular weight of the binder polymer is not particularly limited, but is preferably 1,000 to 2,000,000, more preferably 3,000 to 1,000,000, and even more preferably 5,000 to 600,000.

In a case where a solvent described below is used, it is preferable that the binder polymer exhibits solubility higher than the solubility of the specific compound in a used solvent. If the above aspect is adopted, mobility and heat stability of the obtained organic semiconductor are further improved.

A content of the binder polymer in the organic semiconductor layer of the organic semiconductor element of the present invention is preferably 1 to 200 parts by mass, more preferably 10 to 150 parts by mass, and even more preferably 20 to 120 parts by mass with respect to 100 parts by mass of the content of the specific compound. If the content is within the above range, mobility and heat stability of the obtained organic semiconductor are further improved.

<Other Components>

Other components may be included other than the specific compound and the binder polymer may be included in the organic semiconductor layer according to the organic semiconductor element of the present invention.

As other components, well-known additives and the like can be used.

In the organic semiconductor layer of the present invention, a content of the components other than the specific compound and the binder polymer is preferably 10 mass % or less, more preferably 5 mass % or less, even more preferably 1 mass % or less, and particularly preferably 0.1 mass % or less. If the content of other components is within the above range, film formability is improved, and mobility and heat stability of the obtained organic semiconductor are further improved.

The method of forming the organic semiconductor layer according to the organic semiconductor element of the present invention is not particularly limited. However, a desired organic semiconductor layer can be formed by applying the composition for forming the organic semiconductor film according to the present invention described below to a source electrode, a drain electrode, and a gate insulating film and performing a drying treatment, if necessary.

The organic semiconductor element of the present invention is preferably manufactured using the composition for forming an organic semiconductor film of the present invention described below.

A method of manufacturing an organic semiconductor film or an organic semiconductor element by using the composition for forming an organic semiconductor film of the present invention is not particularly limited, and known methods can be adopted. Examples thereof include a method of manufacturing an organic semiconductor film by applying the composition onto a predetermined base material and if necessary, performing a drying treatment.

The method of applying the composition onto a base material is not particularly limited, and known methods can be adopted. Examples thereof include an ink jet printing method, a screen printing method, a flexographic printing method, a bar coating method, a spin coating method, a knife coating method, a doctor blade method, and the like. An ink jet printing method, a flexographic printing method, and a screen printing method are preferable.

Preferred examples of the flexographic printing method include an aspect in which a photosensitive resin plate is used as a flexographic printing plate. By printing the composition onto a substrate according to the aspect, a pattern can be easily formed.

Among the above methods, the method of manufacturing an organic semiconductor element of the present invention preferably includes a coating step of coating a substrate with the composition for forming an organic semiconductor film of the present invention described below and more preferably includes a coating step of coating a substrate with the composition for forming an organic semiconductor film of the present invention and a removing step of removing the solvent from the composition with which the substrate is coated.

The composition for forming the organic semiconductor film according to the present invention described below includes a solvent and preferably includes an organic solvent.

As the solvent, well-known solvents can be used.

Specifically, examples thereof include a hydrocarbon-based solvent such as hexane, octane, decane, toluene, xylene, mesitylene, ethylbenzene, decalin, and 1-methyl-naphthalene, a ketone-based solvent such as acetone, methyl ethyl ketone, methyl isobutyl ketone, or cyclohexanone, a halogenated hydrocarbon-based solvent such as dichloromethane, chloroform, tetrachloromethane, dichloroethane, trichloroethane, tetrachloroethane, chlorobenzene, dichlorobenzene, and chlorotoluene, an ester-based solvent such as ethyl acetate, butyl acetate, and amyl acetate, an alcohol-based solvent such as methanol, propanol, butanol, pentanol, hexanol, cyclohexanol, methyl cellosolve, ethyl cellosolve, and ethylene glycol, an ether-based solvent such as dibutyl ether, tetrahydrofuran, dioxane, and anisole, an amide-based solvent such as N,N-dimethylformamide and N,N-dimethylacetamide, an imide-based solvent such as 1-methyl-2-pyrrolidone and 1-methyl-2-imidazolidinone, a sulfoxide-based solvent such as dimethylsulfoxide, and a nitrile-based solvent such as acetonitrile.

The solvent may be used singly or two or more types thereof may be used in combination.

Among these, an aliphatic hydrocarbon-based solvent, an aromatic hydrocarbon-based solvent, an aromatic hetero ring-based solvent, a halogenated hydrocarbon-based solvent and/or an ether-based solvent are preferable, an aromatic hydrocarbon-based solvent, a halogenated aromatic hydrocarbon-based solvent and/or an ether-based solvent are more preferable, and toluene, xylene, mesitylene, tetralin, dichlorobenzene, or anisole is even more preferable.

The boiling point of the solvent is preferably 100° C. or higher, in view of film formability. The boiling point of the solvent is more preferably 100° C. to 300° C., even more preferably 125° C. to 250° C., and particularly preferably 150° C. to 225° C.

It is preferable that a boiling point of the solvent of which the content is the greatest is 100° C. or higher and, it is more preferable that a boiling point of the entire solvent is 100° C. or higher.

In a case where the solvent is contained, the content of the specific compound according to the composition for forming the organic semiconductor film of the present invention is preferably 0.05 to 50 mass %, more preferably 0.1 to 25 mass %, even more preferably 0.25 to 15 mass %, particularly preferably 0.4 to 10 mass %. The content of the binder polymer is preferably 0.01 to 50 mass %, more preferably 0.05 to 25 mass %, and even more preferably 0.1 to 10 mass %. If the content is in the range above, the coating properties are excellent, and the organic semiconductor film can be easily formed.

The drying treatment in the removing step is a treatment performed if necessary, and the optimal treatment conditions are appropriately selected according to the type of the specific compound used and the solvent. In view of further improving mobility and heat stability of the obtained organic semiconductor and improving productivity, a heating temperature is preferably 30° C. to 100° C. and more preferably 40° C. to 80° C., and a heating time is preferably 10 to 300 minutes and more preferably 30 to 180 minutes.

A film thickness of the formed organic semiconductor layer is not particularly limited. From the viewpoint of mobility and heat stability of the obtained organic semiconductor, the film thickness is preferably 10 to 500 nm and more preferably 30 to 200 nm.

The organic semiconductor element is not particularly limited, but is preferably an organic semiconductor element having 2 to 5 terminals, and more preferably an organic semiconductor element having 2 or 3 terminals.

It is preferable that the organic semiconductor element is not a photoelectric conversion element.

The organic semiconductor element according to the present invention is preferably a non-luminous organic semiconductor element.

Examples of a 2-terminal element include a rectifier diode, a constant voltage diode, a PIN diode, a Schottky barrier diode, a surge protection diode, a diac, a varistor, a tunnel diode, and the like.

Examples of a 3-terminal element include a bipolar transistor, a Darlington transistor, a field effect transistor, insulated gate bipolar transistor, a uni-junction transistor, a static induction transistor, a gate turn-off thyristor, a triac, a static induction thyristor, and the like.

Among these, a rectifier diode and transistors are preferable, and a field effect transistor is more preferable.

As the field effect transistor, an organic thin film transistor is preferable.

An aspect of the organic thin film transistor of the present invention will be described with reference to a drawing.

FIG. 1 is a schematic cross-sectional view of an aspect of an organic semiconductor element (organic thin film transistor (organic TFT)) of the present invention.

In FIG. 1, an organic thin film transistor 100 comprises a substrate 10, a gate electrode 20 disposed on the substrate 10, a gate insulating film 30 covering the gate electrode 20, a source electrode 40 and a drain electrode 42 which contact a surface of the gate insulating film 30 that is on the side opposite to the gate electrode 20 side, an organic semiconductor film 50 covering a surface of the gate insulating film 30 between the source electrode 40 and the drain electrode 42, and a sealing layer 60 covering each member. The organic thin film transistor 100 is a bottom gate-bottom contact type organic thin film transistor.

In FIG. 1, the organic semiconductor film 50 corresponds to a film formed of the composition described above.

Hereinafter, the substrate, the gate electrode, the gate insulating film, the source electrode, the drain electrode, the sealing layer, and methods for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of applicability to each device and costs, a glass substrate or a plastic substrate is preferable.

Examples of materials of the plastic substrate include a thermosetting resin (for example, an epoxy resin, a phenol resin, a polyimide resin, or a polyester resin (for example, polyethylene terephthalate (PET) or polyethylene naphthalate (PEN)) and a thermoplastic resin (for example, a phenoxy resin, a polyethersulfone, polysulfone, or polyphenylene sulfone).

Examples of materials of the ceramic substrate include alumina, aluminum nitride, zirconia, silicon, silicon nitride, silicon carbide, and the like.

Examples of materials of the glass substrate include soda lime glass, potash glass, borosilicate glass, quartz glass, aluminosilicate glass, lead glass, and the like.

<Gate Electrode, Source Electrode, and Drain Electrode>

Examples of materials of the gate electrode, the source electrode, and the drain electrode include a metal such as gold (Au), silver, aluminum (Al), copper, chromium, nickel, cobalt, titanium, platinum, tantalum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

A thickness of each of the gate electrode, the source electrode, and the drain electrode is not particularly limited, but is preferably 20 to 200 nm.

A method of forming the gate electrode, the source electrode, and the drain electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as ink jet printing, screen printing, offset printing, or relief printing; a mask vapor deposition method; and the like.

<Gate Insulating Film>

Examples of materials of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor film, a polymer is preferable.

In a case where a polymer is used as the material of the gate insulating film, it is preferable to use a cross-linking agent (for example, melamine) in combination. If the cross-linking agent is used in combination, the polymer is cross-linked, and durability of the formed gate insulating film is improved.

A film thickness of the gate insulating film is not particularly limited, but is preferably 100 to 1,000 nm.

A method of forming the gate insulating film is not particularly limited, but examples thereof include a method of coating a substrate, on which the gate electrode is formed, with a composition for forming a gate insulating film, a method of vapor-depositing or sputtering the material of the gate insulating film onto a substrate on which the gate electrode is formed, and the like. A method of coating the aforementioned substrate with the composition for forming a gate insulating film is not particularly limited, and it is possible to use a known method (a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating.

<Binder Polymer Layer>

The organic semiconductor element of the present invention preferably has a layer of the aforementioned binder polymer between a layer containing the aforementioned organic semiconductor layer and an insulating film, and more preferably has a layer of the aforementioned binder polymer between the aforementioned organic semiconductor layer and the gate insulating film. A film thickness of the binder polymer layer is not particularly limited, but is preferably 20 to 500 nm. The binder polymer layer should be a layer containing the aforementioned polymer, and is preferably a layer composed of the aforementioned binder polymer.

A method of forming the binder polymer layer is not particularly limited, and a known method (a bar coating method, a spin coating method, a knife coating method, a doctor blade method, or an ink jet method) can be used.

In a case where the binder polymer layer is formed by performing coating by using a composition for forming a binder polymer layer, for the purpose of removing a solvent, causing cross-linking, or the like, the composition may be heated (baked) after coating.

<Sealing Layer>

From the viewpoint of durability, the organic semiconductor element of the present invention preferably comprises a sealing layer as an outermost layer. In the sealing layer, a known sealant can be used.

A thickness of the sealing layer is not particularly limited, but is preferably 0.2 to 10 μm.

A method of forming the sealing layer is not particularly limited, but examples thereof include a method of coating a substrate, on which the gate electrode, the gate insulating film, the source electrode, the drain electrode, and the organic semiconductor film are formed, with a composition for forming a sealing layer, and the like. Specific examples of the method of coating the substrate with the composition for forming a sealing layer are the same as the examples of the method of coating the substrate with the composition for forming a gate insulating film. In a case where the organic semiconductor film is formed by coating the substrate with the composition for forming a sealing layer, for the purpose of removing the solvent, causing cross-linking, or the like, the composition may be heated (baked) after coating.

Figure 2:
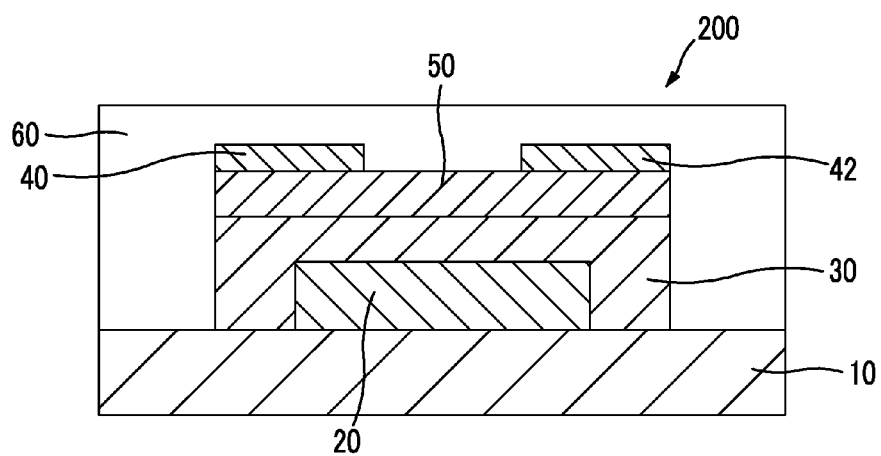
FIG. 2 is a schematic cross-sectional view of another aspect of the organic semiconductor element of the present invention.

FIG. 2 is a schematic cross-sectional view of another aspect of the organic semiconductor element (organic thin film transistor) of the present invention.

In FIG. 2, an organic thin film transistor 200 comprises the substrate 10, the gate electrode 20 disposed on the substrate 10, the gate insulating film 30 covering the gate electrode 20, the organic semiconductor film 50 disposed on the gate insulating film 30, the source electrode 40 and the drain electrode 42 disposed on the organic semiconductor film 50, and the sealing layer 60 covering each member. Herein, the source electrode 40 and the drain electrode 42 are formed using the aforementioned composition of the present invention. The organic thin film transistor 200 is a bottom gate-top contact type organic thin film transistor.

The substrate, the gate electrode, the gate insulating film, the source electrode, the drain electrode, the organic semiconductor film, and the sealing layer are as described above.

In FIGS. 1 and 2, the aspects of the bottom gate-bottom contact type organic thin film transistor and the bottom gate-top contact type organic thin film transistor were specifically described. However, the organic semiconductor element of the present invention can also suitably used in a top gate-bottom contact type organic thin film transistor and a top gate-top contact type organic thin film transistor.

The organic thin film transistor described above can be suitably used for electronic paper and a display device.

(Compound)

The compound according to the present invention is a compound (the specific compound) having a constitutional repeating unit represented by Formula 1 above and preferably an organic semiconductor compound having a constitutional repeating unit represented by Formula 1.

The compound having the constitutional repeating unit represented by Formula 1 in the compound according to the present invention has the same meaning as the compound having the constitutional repeating unit represented by Formula 1 described above and a preferable aspect thereof is also the same.

(Composition for Forming Organic Semiconductor Film)

The composition for forming the organic semiconductor film according to the present invention contains the compound (aforementioned specific compound) according to the present invention and a solvent.

The composition for forming the organic semiconductor film according to the present invention preferably contains a binder polymer.

The specific compound, the binder polymer, and the solvent in the composition for forming the organic semiconductor film according to the present invention have the same meanings as the specific compound, the binder polymer, and the solvent described above, and preferable aspects thereof are also the same.

The content of the specific compound in the composition for forming the organic semiconductor film according to the present invention is not particularly limited, but is preferably 0.005 to 10 mass %, more preferably 0.01 to 5 mass %, and even more preferably 0.05 to 3 mass % with respect to the total amount of the composition for forming the organic semiconductor film.

The composition for forming the organic semiconductor film according to the present invention may include other component in addition to the specific compound, the binder polymer, and the solvent.

As the component, well-known additives may be used.

The content of the component in addition to the specific compound, the binder polymer, and the solvent in the composition for forming the organic semiconductor film according to the present invention is preferably 10 mass % or less, more preferably 5 mass % or less, even more preferably 1 mass % or less, and particularly preferably 0.1 mass % or less with respect to the total solid content. If the content is in the range described above, film formability is improved, and mobility and heat stability of the obtained organic semiconductor are further improved. The solid content is an amount of the components excluding the volatilizable component such as the solvent.

The viscosity of the composition for forming the organic semiconductor film according to the present invention is not particularly limited. However, in view of excellent coating properties, the viscosity is preferably 3 to 100 mPa·s, more preferably 5 to 50 mPa·s, and even more preferably 9 to 40 mPa·s. The viscosity according to the present invention refers to viscosity at 25° C.

As a method of measuring the viscosity, a measuring method in conformity of JIS Z8803 is preferable.

The method of manufacturing the composition for forming the organic semiconductor film according to the present invention is not particularly limited, and well-known methods can be applied. For example, a desired composition can be obtained by adding a specific amount of a specific compound in the solvent and applying an appropriate stirring treatment. In a case where the binder polymer is used, the specific compound and the binder polymer are simultaneously or sequentially added, so as to suitably manufacture the composition.

(Organic Semiconductor Film)

The organic semiconductor film according to the present invention contains the specific compound.

The organic semiconductor film according to the present invention preferably contains a binder polymer.

The specific compound and the binder polymer in the organic semiconductor film according to the present invention have the same meanings as the specific compound and the binder polymer described above in the organic semiconductor element according to the present invention, and preferable aspects thereof are also the same.

The composition for forming the organic semiconductor film according to the present invention may include other components in addition to the specific compound and the binder polymer.

As the component, well-known additives may be used.

The content of the component in addition to the specific compound and the binder polymer in the organic semiconductor film according to the present invention preferably 10 mass % or less, more preferably 5 mass % or less, even more preferably 1 mass % or less, and particularly preferably 0.1 mass % or less. If the content is in the range above, film formability is improved, and mobility and heat stability of the obtained organic semiconductor are further improved. The solid content is an amount of components other than the volatilizable components such as the solvent.

The film thickness of the organic semiconductor film according to the present invention is not particularly limited. However, in view of mobility and heat stability of the obtained organic semiconductor, the film thickness is preferably 10 to 500 nm and more preferably 30 to 200 nm.

The organic semiconductor film according to the present invention can be suitably used in the organic semiconductor element, and can be particularly suitably used in the organic transistor (organic thin film transistor).

The organic semiconductor film according to the present invention can be suitably manufactured by using the composition for forming the organic semiconductor film according to the present invention.

The method of manufacturing the organic semiconductor film according to the present invention is not particularly limited, and well-known methods can be employed. Examples thereof include a method of manufacturing an organic semiconductor film by applying the composition for forming the organic semiconductor film according to the present invention on a predetermined base material and performing a dry treatment, if necessary.

The method of applying the composition on the base material is not particularly limited. Examples thereof include an inkjet printing method, a screen printing method, a flexographic printing method, a bar coating method, a spin coating method, a knife coating method, and a doctor blade method. An inkjet printing method, a screen printing method, and a flexographic printing method are preferable.

Among these, the method of manufacturing the organic semiconductor film according to the invention preferably includes a coating step of coating the substrate with the composition for forming the organic semiconductor film according to the present invention and more preferably includes a coating step of coating a substrate with the composition for forming the organic semiconductor film according to the present invention and a removing step of removing the solvent from the coated composition.

EXAMPLES

Hereinafter, the present invention will be more specifically described based on examples. The materials and the amount thereof used, the proportion of the materials, the content and procedure of treatments, and the like described in the following examples can be appropriately changed within a scope that does not depart from the gist of the present invention. Accordingly, the scope of the present invention is not limited to the following specific examples. Herein, unless otherwise specified, "part" and "%" are based on mass.

<Organic Semiconductor>

Structures of Compounds 1 to 9 and Comparative Compounds 1 to 3 which were used in the organic semiconductor layer are provided below.

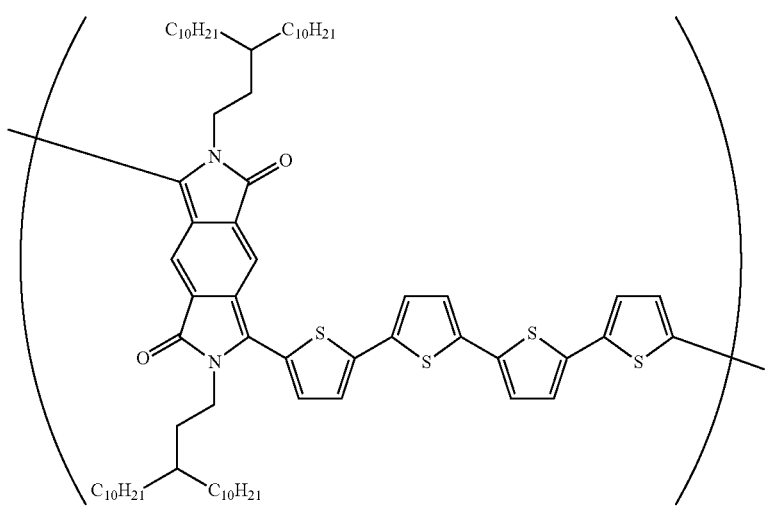
Compound 1
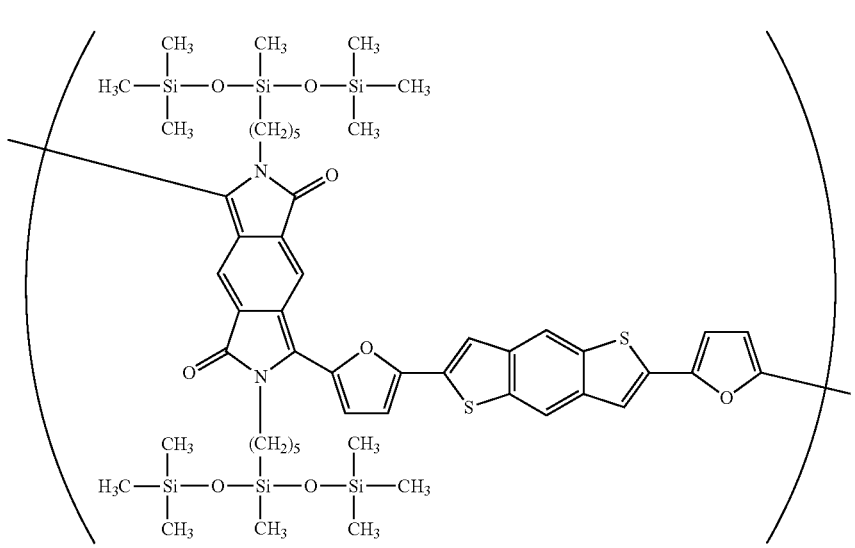
Compound 2
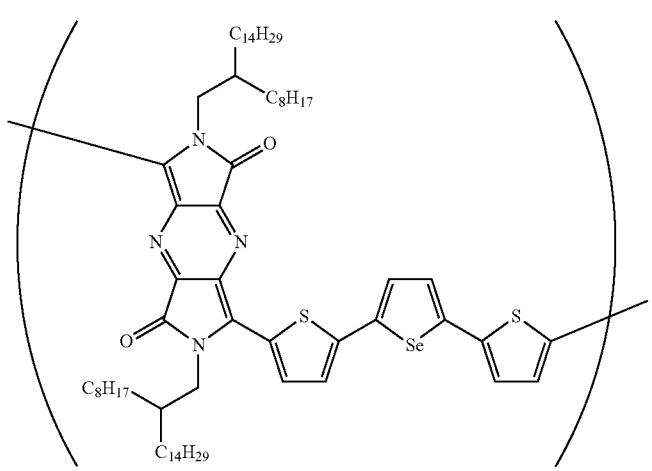
Compound 3

Compound 4
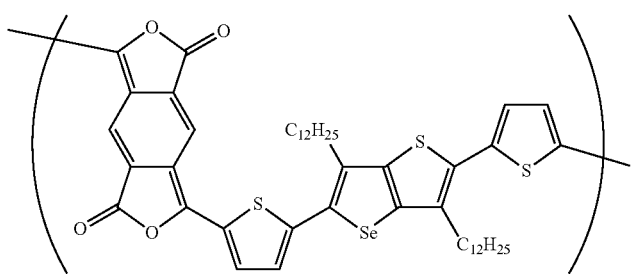
Compound 5
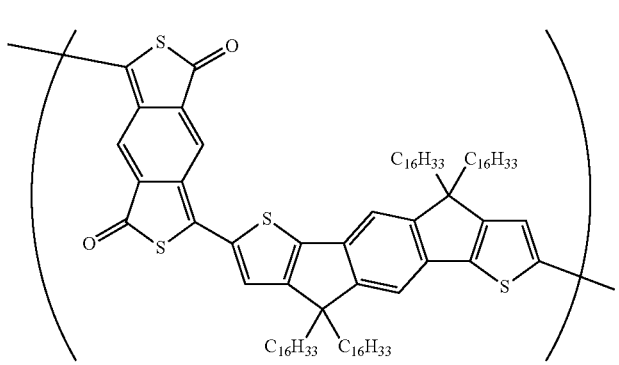
Compound 6
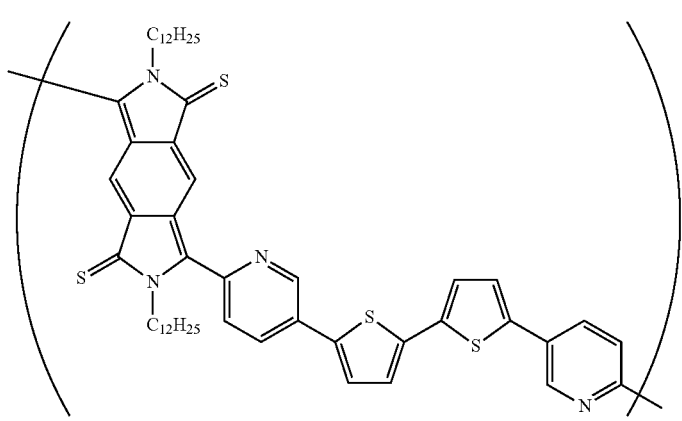
Compound 7
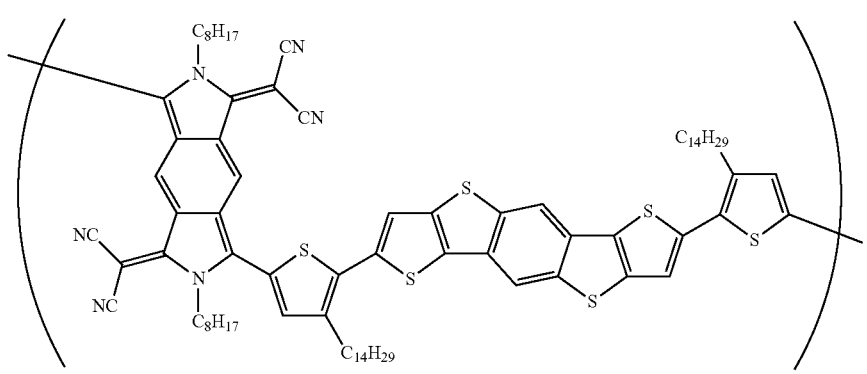

Compound 8
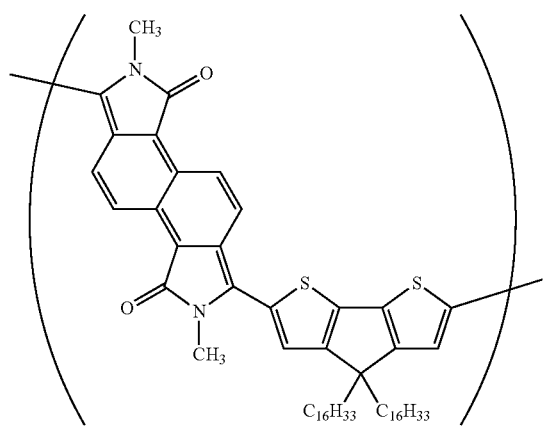
(Compound 9)
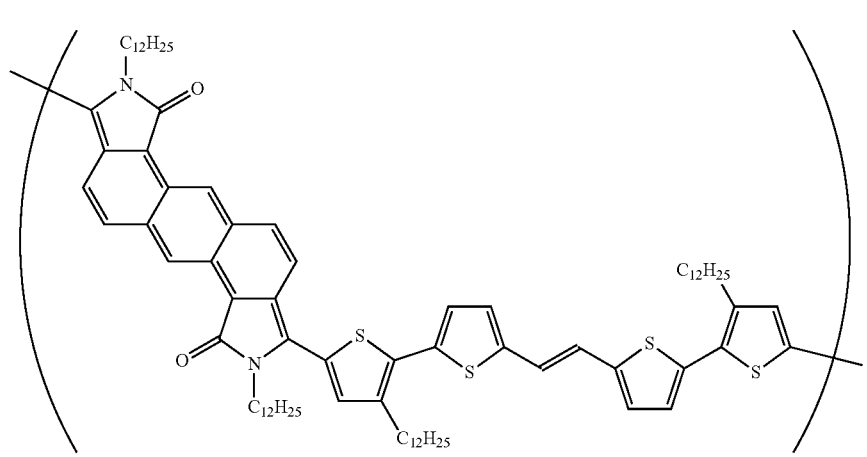
Comparative Compound 1
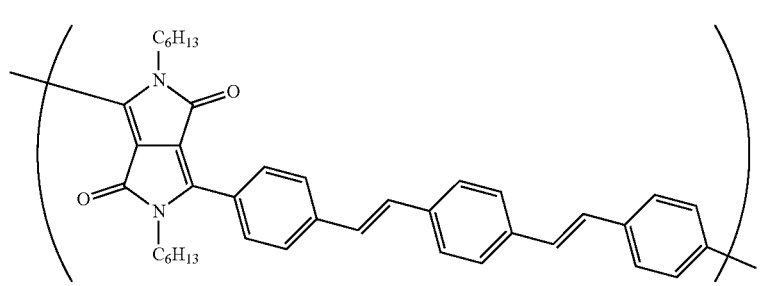
Comparative Compound 2
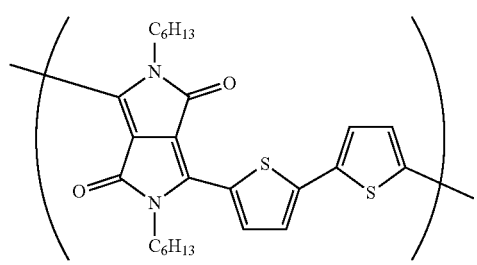

Comparative Compound 3
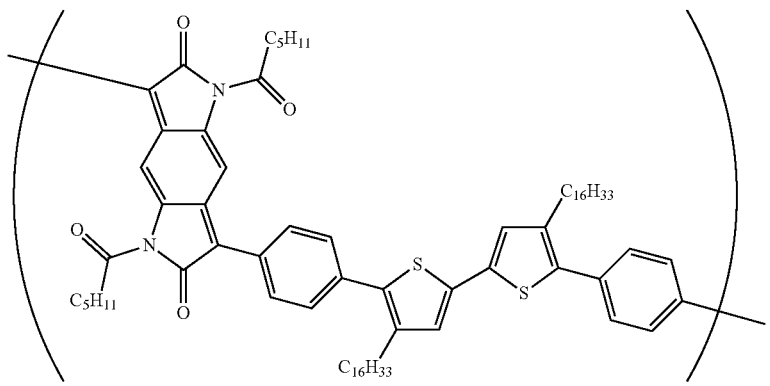
Synthesis Example
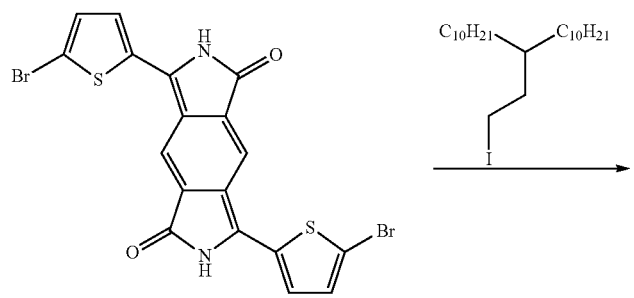
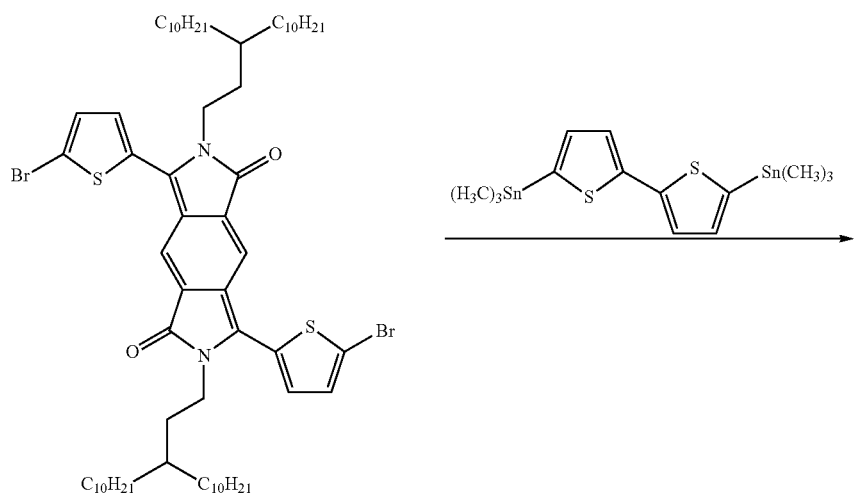
Synthesis Intermediate 1

-continued

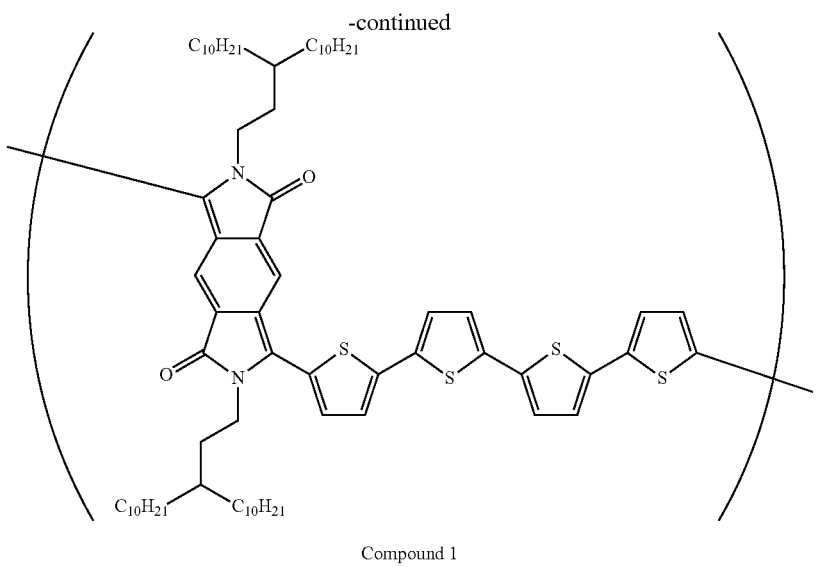

Compound 1

With reference to a method disclosed in JP2014-82473A, Synthesis Intermediate 1 was synthesized.

Synthesis Intermediate 1 (231 mg, 0.2 mmol), 5,5'-bis(trimethylstannyl) bithiophene (manufactured by Sigma-Aldrich Co. LLC., 98 mg, 0.2 mmol), tri(o-tolyl) phosphine (manufactured by Wako Pure Chemical Industries, Ltd., 4.9 mg, 0.016 mmol), tris(dibenzylideneacetone) dipalladium (manufactured by Tokyo Chemical Industry Co., Ltd., 3.7 mg, 0.004 mmol), and dehydrated chlorobenzene (manufactured by Wako Pure Chemical Industries, Ltd., 20 mL) were mixed and were stirred at 130° C. for 72 hours under a nitrogen atmosphere. After the reaction solution was cooled to room temperature, 100 mL of methanol and 8 mL of concentrated hydrochloric acid were added and were stirred for 16 hours. The precipitated solid content was filtrated and washed with methanol, Soxhlet extraction was sequentially performed with ethanol, ethyl acetate, and chloroform, and soluble impurities were removed. Soxhlet extraction was performed with chlorobenzene, the solution was concentrated under reduced pressure, methanol was added, and the precipitated solid was filtered and washed with methanol, so as to obtain 111 mg of Compound 1 (yield: 48%).

With respect to Compounds 2 to 9, synthesis was performed in the method in conformity with Compound 1.

Comparative Compounds 1 and 2 were compounds disclosed in Examples 2 and 12 of JP2007-516315A.

Comparative Compound 3 was Polymer Compound A disclosed in JP2013-57007A.

<Binder Polymer>

Polymers used as binder polymers in Examples are provided below.

PαMS: Poly-α-methyl styrene, weight-average molecular weight: 437,000, manufactured by Sigma-Aldrich Co. LLC.

PTAA: Poly[bis(4-phenyl)(2,4,6-trimethylphenyl)amine], number-average molecular weight: 7,000 to 10,000, manufactured by Sigma-Aldrich Co. LLC.

PCPDTBT: Poly[2,6-(4,4-bis(2-ethylhexyl)-4H-cyclopenta[2, 1-b;3,4-b']dithiophene)-alt-4,7-(2,1,3-benzothiadiazole)], weight-average molecular weight: 7,000 to 20,000, manufactured by Sigma-Aldrich Co. LLC.

<Preparing Composition for Forming Organic Semiconductor Film>

An organic semiconductor compound (0.25 mass %)/a binder polymer (concentration disclosed in Table 1)/anisole presented in Table 1 was weighed in glass vial, stirring and mixing was performed for 10 minutes with a mix rotor (manufactured by As One Corporation), and filtration was performed with a 0.5 μm membrane filter, so as to obtain the composition for forming the organic semiconductor film. In Table 1, "-" presented in a polymer (binder) indicates that the polymer (binder) was not included.

<Manufacturing of TFT Element>

Al that became a gate electrode was vapor-deposited on the glass substrate (EAGLE XG: manufactured by Corning Incorporated) (Thickness: 50 nm). Spin coating was performed with a composition (solution (concentration of solid contents: 2 mass %) of propylene glycol monomethyl ether acetate (PGMEA) of polyvinylphenol/melamine=1 part by mass/1 part by mass (w/w)) for forming a gate insulating film, and the gate insulating film having a film thickness of 400 nm was formed by performing baking at 150° C. for 60 minutes. Shapes of source electrodes and drain electrodes (channel length: 40 μm, channel width: 200 μm) were drawn thereon, with silver ink (H-1, manufactured by Mitsubishi Materials Corporation) by using an inkjet device DMP-2831 (manufactured by Fujifilm Corporation). Thereafter, baking was performed in an oven at 180° C. for 30 minutes, sintering was performed, and source electrodes and drain electrodes were formed, so as to obtain an element substrate for TFT characteristic evaluation.

In a nitrogen glove box, spin coating was performed on the element substrate for TFT characteristic evaluation with the composition for forming the respective compositions for forming organic semiconductor films (for 10 seconds at 500 rpm and for 30 seconds at 1,000 rpm), and drying was performed on a hot plate at 200° C. for 10 minutes, so as to form an organic semiconductor layer such that a bottom gate bottom contact-type organic TFT element was obtained.

<Characteristic Evaluation>

The following performance evaluation was carried out under the atmosphere by using a semiconductor characteristic evaluation device B2900A (manufactured by Agilent Technologies).

(a) Carrier Mobility

Carrier mobility μ was calculated by applying a voltage of −60V between source electrodes-drain electrodes of the respective organic TFT elements, changing gate voltages in the range of +10 V to −60 V, and using an equation below indicating a drain current $I_d$.

$$I_d = (w/2L)\mu C_i (V_g - V_{th})^2$$

In the equation, L represents a gate length, w represents a gate width, $C_i$ represents capacity per unit area of an insulating layer, $V_g$ represents a gate voltage, and $V_{th}$ represents a threshold voltage.

As carrier mobility μ is higher, the carrier mobility μ is more preferable. In practice the carrier mobility μ is more preferably $1\times10^{-2}$ cm$^2$/Vs or greater and even more preferably $1\times10^{-1}$ cm$^2$/Vs or greater. If the mobility was lower than $1\times10^{-5}$ cm$^2$/Vs, characteristics were too small, and thus the evaluation was not performed.

(b) Temporal Stability Under High Humidity

In a case where the respective manufactured organic thin film transistor elements were stored at 25° C., under the humidity of 80% RH for 24 hours and carrier mobility was measured, the carrier mobility maintenance ratio was evaluated in the following four stages and was set as an index of temporal stability under high humidity. As this value is greater, stability under high humidity is high. In practice, A was preferable.

Carrier mobility maintenance ratio after storage under high humidity (%)=mobility (after storage under high humidity)/mobility (before storage under high humidity)

A: 80% or greater
B: 60% or greater and less than 80%
C: 40% or greater and less than 60%
D: Less than 40%

TABLE 1

| | Element Number | Organic semiconductor | Mn of organic semiconductor | Mw of organic semiconductor | Binder polymer (mass %) | Carrier mobility (cm$^2$/Vs) | Temporal stability under high humidity |
|---|---|---|---|---|---|---|---|
| Example 1 | Element 1-1 | Compound 1 | 84,000 | 350,000 | — | $2.5 \times 10^{-1}$ | A |
| Example 2 | Element 1-2 | Compound 1 | 84,000 | 350,000 | PαMS (0.5) | $2.9 \times 10^{-1}$ | A |
| Example 3 | Element 1-3 | Compound 2 | 14,000 | 52,000 | — | $9.6 \times 10^{-2}$ | A |
| Example 4 | Element 1-4 | Compound 3 | 45,000 | 140,000 | — | $7.2 \times 10^{-2}$ | B |
| Example 5 | Element 1-5 | Compound 4 | 28,000 | 98,000 | — | $9.5 \times 10^{-1}$ | A |
| Example 6 | Element 1-6 | Compound 4 | 52,000 | 180,000 | PTAA (0.125) | $9.5 \times 10^{-1}$ | A |
| Example 7 | Element 1-7 | Compound 5 | 66,000 | 220,000 | — | $1.2 \times 10^{-1}$ | A |
| Example 8 | Element 1-8 | Compound 5 | 66,000 | 220,000 | PCPDTBT (0.25) | $1.4 \times 10^{-1}$ | A |
| Example 9 | Element 1-9 | Compound 6 | 80,000 | 290,000 | — | $8.7 \times 10^{-2}$ | B |
| Example 10 | Element 1-10 | Compound 7 | 37,000 | 150,000 | — | $9.2 \times 10^{-2}$ | A |
| Example 11 | Element 1-11 | Compound 8 | 55,000 | 240,000 | — | $6.9 \times 10^{-2}$ | A |
| Example 12 | Element 1-12 | Compound 9 | 42,000 | 170,000 | — | $5.7 \times 10^{-2}$ | A |
| Comparative Example 1 | Element 1-13 | Comparative Compound 1 | 10,000 | 31,000 | — | $1.5 \times 10^{-5}$ | D |
| Comparative Example 2 | Element 1-14 | Comparative Compound 2 | 400 | 1,250 | — | $<1.0 \times 10^{-5}$ | — |
| Comparative Example 3 | Element 1-15 | Comparative Compound 3 | 12,000 | 23,000 | — | $1.9 \times 10^{-4}$ | D |

EXPLANATION OF REFERENCES

10: substrate
20: gate electrode
30: gate insulating film
40: source electrode
42: drain electrode
50: organic semiconductor film
60: sealing layer
100, 200: organic thin film transistor

What is claimed is:
1. An organic semiconductor element comprising:
an organic semiconductor layer containing a compound having a constitutional repeating unit represented by Formula 1,

61

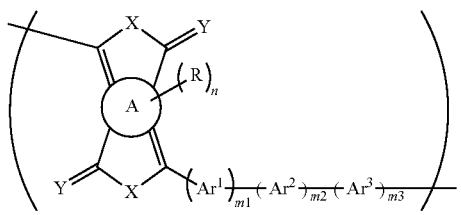
(1)

in Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms of an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

2. The organic semiconductor element according to claim 1, wherein the constitutional repeating unit represented by Formula 1 is a constitutional repeating unit represented by Formula 2,

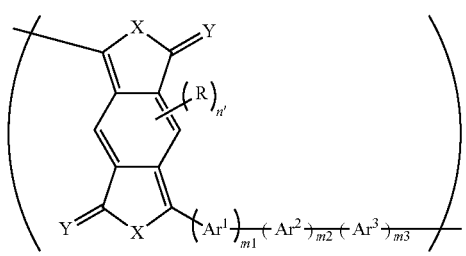
(2)

in Formula 2, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$ and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

3. The organic semiconductor element according to claim 1, wherein X represents O, S, or NR.

4. The organic semiconductor element according to claim 1, wherein Y represents O or S.

5. The organic semiconductor element according to claim 1, wherein the constitutional repeating unit represented by Formula 1 is a constitutional repeating unit represented by Formula 3,

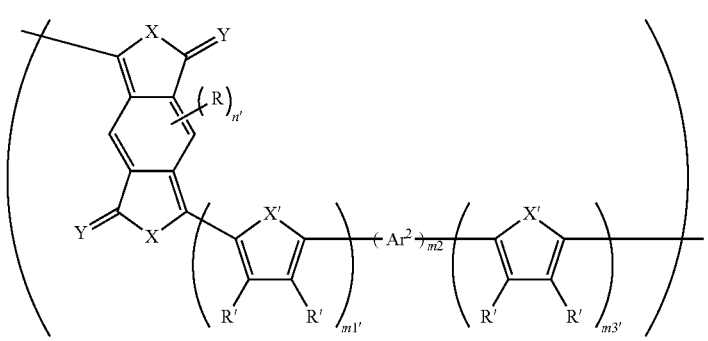
(3)

in Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^{2}$'s each independently represent an aromatic hydrocarbon group, an aromatic heterocyclic group, a vinylene group, or an ethynylene group, X"'s each independently represent O or S, R"'s each independently represent a hydrogen atom or an alkyl group, m1' and m3' each independently represent an integer of 0 to 2, m2 represents an integer of 0 to 4, and n' represents an integer of 0 to 2.

6. A compound comprising:
a constitutional repeating unit represented by Formula 1,

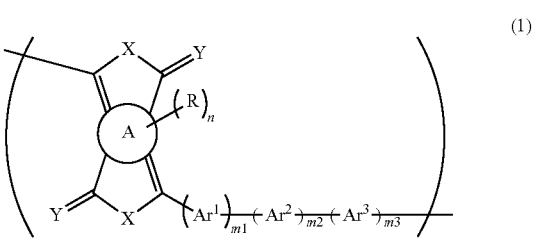
(1)

in Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms of an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

7. The compound according to claim 6, wherein the constitutional repeating unit represented by Formula 1 is a constitutional repeating unit represented by Formula 2,

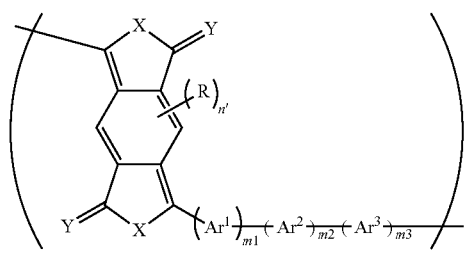

(2)

in Formula 2, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

8. The compound according to claim 6, wherein X represents O, S, or NR.

9. The compound according to claim 6, wherein Y represents O or S.

10. The compound according to claim 6, wherein the constitutional repeating unit represented by Formula 1 is a constitutional repeating unit represented by Formula 3,

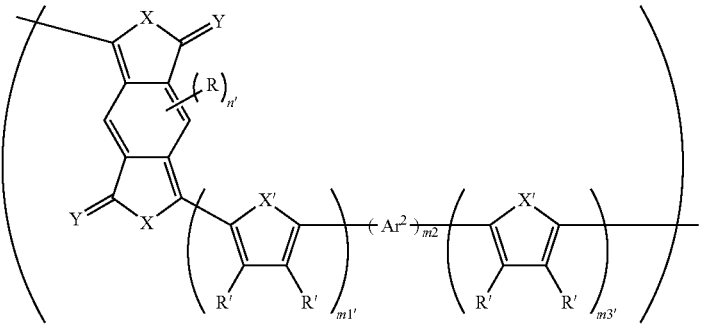

(3)

in Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^2$'s each independently represent an aromatic hydrocarbon group, an aromatic heterocyclic group, a vinylene group, or an ethynylene group, X"s each independently represent O or S, R"s each independently represent a hydrogen atom or an alkyl group, m1' and m3' each independently represent an integer of 0 to 2, m2 represents an integer of 0 to 4, and n' represents an integer of 0 to 2.

11. The compound according to claim 6, which is an organic semiconductor compound.

12. A composition for forming an organic semiconductor film, comprising:
the compound according to claim 6; and
a solvent.

13. The composition for forming an organic semiconductor film according to claim 12, further comprising:
a binder polymer.

14. An organic semiconductor film comprising:
a compound having a constitutional repeating unit represented by Formula 1,

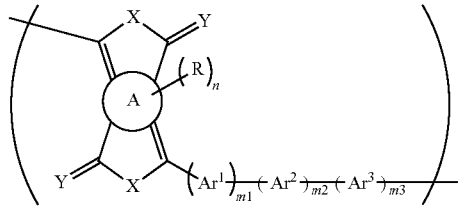

(1)

in Formula 1, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, the ring A represents an unsaturated hydrocarbon ring or a ring obtained by substituting some of the carbon atoms of an unsaturated hydrocarbon ring with nitrogen atoms, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n represents an integer of 0 to 6.

15. The organic semiconductor film according to claim 14, wherein the constitutional repeating unit represented by Formula 1 is a constitutional repeating unit represented by Formula 2,

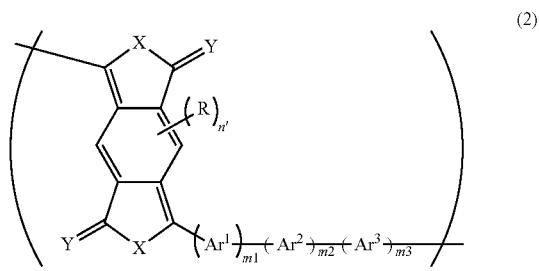

(2)

in Formula 2, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^1$, $Ar^2$, and $Ar^3$ each independently represent an aromatic hydrocarbon group, an aromatic heterocyclic group, a vinylene group, or an ethynylene group, m1 and m3 each independently represent an integer of 0 to 2, m2 represents an integer of 0 to 4, and n' represents an integer of 0 to 2.

16. The organic semiconductor film according to claim 14, wherein X represents O, S, or NR.

17. The organic semiconductor film according to claim 14, wherein Y represents O or S.

18. The organic semiconductor film according to claim 14, wherein the constitutional repeating unit represented by Formula 1 is a constitutional repeating unit represented by Formula 3,

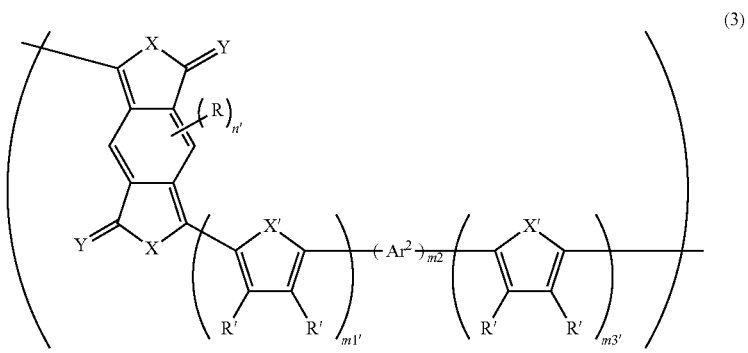

(3)

in Formula 3, X's each independently represent $CH_2$, CHR, $CR_2$, NR, O, S, Se, or $SiR_2$, Y's each independently represent O, S, N—CN, or $CQ_2$, Q represents CN, $CF_3$, COR, COOR, or $SO_2R$, R's each independently represent a monovalent substituent, a plurality of R's may form rings, $Ar^{2\prime}$'s each independently represent an aromatic hydrocarbon group, an aromatic heterocyclic group, a vinylene group, or an ethynylene group, X"s each independently represent O or S, R"s each independently represent a hydrogen atom or an alkyl group, m1' and m3' each independently represent an integer of 0 to 2, m2 represents an integer of 0 to 4, and n' represents an integer of 0 to 2.

19. A method of manufacturing an organic semiconductor film, comprising:

a coating step of coating a substrate with the composition for forming an organic semiconductor film according to claim 12.

20. A method of manufacturing an organic semiconductor element, comprising:

a coating step of coating a substrate with the composition for forming an organic semiconductor film according to claim 12.

\* \* \* \* \*